(12) United States Patent
Wu et al.

(10) Patent No.: US 11,088,116 B2
(45) Date of Patent: Aug. 10, 2021

(54) BONDED ASSEMBLY CONTAINING HORIZONTAL AND VERTICAL BONDING INTERFACES AND METHODS OF FORMING THE SAME

(71) Applicant: SANDISK TECHNOLOGIES LLC, Addison, TX (US)

(72) Inventors: Chen Wu, Leuven (BE); Peter Rabkin, Cupertino, CA (US); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/694,438

(22) Filed: Nov. 25, 2019

(65) Prior Publication Data
US 2021/0159216 A1 May 27, 2021

(51) Int. Cl.
*H01L 25/065* (2006.01)
*H01L 21/768* (2006.01)
(Continued)

(52) U.S. Cl.
CPC .... *H01L 25/0657* (2013.01); *H01L 21/76898* (2013.01); *H01L 21/8221* (2013.01);
(Continued)

(58) Field of Classification Search
CPC ............. H01L 21/8221; H01L 25/0657; H01L 27/0688
See application file for complete search history.

(56) References Cited

U.S. PATENT DOCUMENTS 5,915,167 A * 6/1999 Leedy .................. G11C 29/846
 438/108
6,271,597 B1 * 8/2001 Medlen .................. B23K 20/02
 257/774
(Continued)

FOREIGN PATENT DOCUMENTS

KR 10-2019-0122794 A 10/2019

OTHER PUBLICATIONS

Notification of Transmittal of the International Search Report and Written Opinion of the International Search Authority for International Patent Application No. PCT/US2020/023493, dated Aug. 21, 2020, 11 pages.
(Continued)

*Primary Examiner* — Dale E Page
*Assistant Examiner* — Wilner Jean Baptiste
(74) *Attorney, Agent, or Firm* — The Marbury Law Group PLLC

(57) ABSTRACT

A first semiconductor die includes first bonding pads. The first bonding pads include proximal bonding pads embedded within a first bonding dielectric layer and distal bonding pads having at least part of the sidewall that overlies the first bonding dielectric layer. A second semiconductor die includes second bonding pads. The second bonding pads are bonded to the proximal bonding pads and the distal bonding pads. The proximal bonding pads are bonded to a respective one of a first subset of the second bonding pads at a respective horizontal bonding interface and the distal bonding pads are bonded to a respective one of a second subset of the second bonding pads at a respective vertical bonding interface at the same time. Dielectric isolation structures may vertically extend through the second bonding dielectric layer of the second semiconductor die and contact the first bonding dielectric layer.

11 Claims, 16 Drawing Sheets

(51) Int. Cl.
*H01L 21/822* (2006.01)
*H01L 27/06* (2006.01)
*H01L 23/00* (2006.01)
*H01L 25/00* (2006.01)

(52) U.S. Cl.
CPC .............. *H01L 24/03* (2013.01); *H01L 24/05* (2013.01); *H01L 25/50* (2013.01); *H01L 27/0688* (2013.01)

(56) References Cited

U.S. PATENT DOCUMENTS

| | | | |
|---|---|---|---|
| 10,115,681 | B1 | 10/2018 | Ariyoshi |
| 10,283,493 | B1 | 5/2019 | Nishida |
| 10,319,701 | B2 | 6/2019 | Yu et al. |
| 10,354,980 | B1 | 7/2019 | Mushiga et al. |
| 10,354,987 | B1 | 7/2019 | Mushiga et al. |
| 10,381,322 | B1 | 8/2019 | Azuma et al. |
| 10,381,362 | B1 | 8/2019 | Cui et al. |
| 2009/0224371 | A1 | 9/2009 | Yu et al. |
| 2012/0241216 | A1 | 9/2012 | Coppeta et al. |
| 2015/0187736 | A1 | 7/2015 | Chen et al. |
| 2016/0093591 | A1* | 3/2016 | Lan .................... H01L 21/8221 257/506 |
| 2017/0005000 | A1* | 1/2017 | Beyne ................ H01L 21/0212 |
| 2018/0277497 | A1* | 9/2018 | Matsuo .................... H01L 25/18 |
| 2019/0221557 | A1 | 7/2019 | Kim et al. |
| 2019/0252361 | A1 | 8/2019 | Nishida |

OTHER PUBLICATIONS

U.S. Appl. No. 16/284,502, filed Feb. 25, 2019, SanDisk Technologies LLC.
U.S. Appl. No. 16/278,372, filed Feb. 18, 2019, SanDisk Technologies LLC.
U.S. Appl. No. 16/295,292, filed Mar. 7, 2019, SanDisk Technologies LLC.
U.S. Appl. No. 16/385,010, filed Apr. 16, 2019, SanDisk Technologies LLC.
U.S. Appl. No. 16/409,593, filed May 10, 2019, SanDisk Technologies LLC.
U.S. Appl. No. 16/248,923, filed Jan. 16, 2019, SanDisk Technologies LLC.
U.S. Appl. No. 16/231,752, filed Dec. 24, 2018, SanDisk Technologies LLC.
U.S. Appl. No. 16/274,687, filed Feb. 13, 2019, SanDisk Technologies LLC.
U.S. Appl. No. 16/291,457, filed Mar. 4, 2019, SanDisk Technologies LLC.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/242,216, filed Jan. 8, 2019, SanDisk Technologies LLC.
U.S. Appl. No. 16/255,413, filed Jan. 23, 2019, SanDisk Technologies LLC.
U.S. Appl. No. 16/249,423, filed Jan. 16, 2019, SanDisk Technologies LLC.
U.S. Appl. No. 16/269,301, filed Feb. 6, 2019, SanDisk Technologies LLC.
U.S. Appl. No. 16/275,668, filed Feb. 14, 2019, SanDisk Technologies LLC.
U.S. Appl. No. 16/273,908, filed Apr. 2, 2019, SanDisk Technologies LLC.
U.S. Appl. No. 16/417,913, filed May 21, 2019, SanDisk Technologies LLC.
U.S. Appl. No. 16/391,632, filed Apr. 23, 2019, SanDisk Technologies LLC.
U.S. Appl. No. 16/440,183, filed Jun. 13, 2019, SanDisk Technologies LLC.
U.S. Appl. No. 16/521,849, filed Jul. 25, 2019, SanDisk Technologies LLC.
U.S. Appl. No. 16/523,029, filed Jul. 26, 2019, SanDisk Technologies LLC.
U.S. Appl. No. 16/552,089, filed Aug. 27, 2019, SanDisk Technologies LLC.
U.S. Appl. No. 16/589,404, filed Oct. 1, 2019, SanDisk Technologies LLC.
U.S. Appl. No. 16/660,177, filed Oct. 22, 2019, SanDisk Technologies LLC.
U.S. Appl. No. 16/671,025, filed Oct. 31, 2019, SanDisk Technologies LLC.
U.S. Appl. No. 16/682,848, filed Nov. 13, 2019, SanDisk Technologies LLC.

* cited by examiner

BONDED ASSEMBLY CONTAINING HORIZONTAL AND VERTICAL BONDING INTERFACES AND METHODS OF FORMING THE SAME

FIELD

The present disclosure relates generally to the field of semiconductor devices, and particularly to a bonded assembly containing horizontal bonding interfaces and vertical bonding interfaces and methods for forming the same.

BACKGROUND

Wafer bonding or die bonding can be employed to provide a bonded assembly of multiple semiconductor dies. For example, two semiconductor dies providing different functionalities can be bonded to provide a semiconductor chip having combined functionalities. Metal wiring inside each semiconductor die provides metal interconnection between components within a respective semiconductor die.

SUMMARY

According to an embodiment of the present disclosure, a bonded assembly includes a first semiconductor die comprising first semiconductor devices, a first bonding dielectric layer, and first bonding pads having a top surface facing away from the first semiconductor devices, a bottom surface facing the first semiconductor devices and at least one sidewall between the top surface and the bottom surface, and a second semiconductor die comprising second semiconductor devices, a second bonding dielectric layer, dielectric isolation structures vertically extending through the second bonding dielectric layer and contacting the first bonding dielectric layer, and second bonding pads having a top surface facing away from the second semiconductor devices, a bottom surface facing the second semiconductor devices and at least one sidewall between the top surface and the bottom surface. The sidewalls of the second bonding pads are bonded to the respective sidewalls of the first bonding pads.

According to another embodiment of the present disclosure, a method of forming a bonded assembly is provided, which comprises: providing a first semiconductor die comprising a first substrate, first semiconductor devices, first metal interconnect structures embedded in first dielectric material layers that laterally extend along horizontal directions, and first bonding pads that are electrically connected to a respective node of the first semiconductor devices through a respective subset of the first metal interconnect structures, wherein the first bonding pads comprise proximal bonding pads embedded within a first bonding dielectric layer and distal bonding pads that overlie the first bonding dielectric layer; providing a second semiconductor die comprising a second substrate, second semiconductor devices, second metal interconnect structures embedded in second dielectric material layers that laterally extend along the horizontal directions, and second bonding pads that are electrically connected to a respective node of the second semiconductor devices through a respective subset of the second metal interconnect structures; and bonding the second bonding pads to the proximal bonding pads and the distal bonding pads at the same time, wherein the proximal bonding pads are bonded to a respective one of a first subset of the second bonding pads at a respective horizontal bonding interface and the distal bonding pads are bonded to a respective one of a second subset of the second bonding pads at a respective vertical bonding interface.

DETAILED DESCRIPTION

Figure 1A:
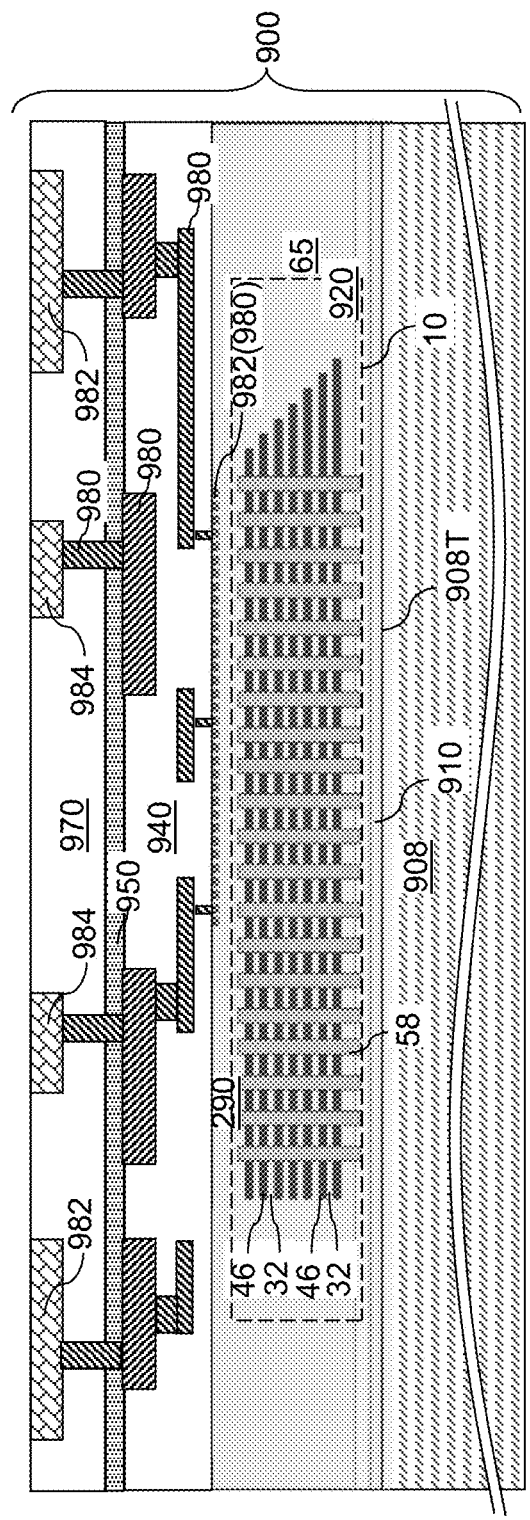
FIGS. 1A-1D are sequential schematic vertical cross-sectional views of a first semiconductor die prior to bonding according to a first embodiment of the present disclosure.

Bonding pads that are bonded to each other using their top surfaces provide only vertical connections between two semiconductor dies with horizontal bonding interfaces that are parallel to a gap between the two semiconductor dies. This limits the number of bonding locations that may be provided between the two dies. As discussed above, the embodiments of the present disclosure are directed to a bonded assembly containing horizontal bonding interfaces and vertical bonding interfaces which may be made at the same time, and methods for forming the same, the various aspects of which are described herein in detail. The lateral bonding increases the number and density of bonding locations between bonded dies.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

Referring to FIG. 1A, a first semiconductor die 900 according to an embodiment of the present disclosure is illustrated. The first semiconductor die 900 includes a first substrate 908, first semiconductor devices 920 overlying the first substrate 908, first dielectric material layers (290, 940) overlying the first semiconductor devices 920, and first metal interconnect structures 980 embedded in the first dielectric material layers (290, 940). In one embodiment, the first substrate 908 may be a commercially available silicon wafer having a thickness in a range from 500 microns to 1 mm.

Generally, the first semiconductor devices 920 may comprise any semiconductor device known in the art. In one embodiment, the first semiconductor die 900 comprises a memory die, and may include memory devices, such as a three-dimensional NAND memory device. In an illustrative example, the first semiconductor devices 920 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device.

A memory opening fill structure 58 may be formed within each memory opening. A memory opening fill structure 58 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc. The memory device may include an optional horizontal semiconductor channel layer 10 connected to the bottom end of each vertical semiconductor channel, and an optional dielectric spacer layer 910 that provides electrical isolation between the first substrate 908 and the horizontal semiconductor channel layer 10.

The electrically conductive layers 46 may be patterned to provide a terrace region in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation between neighboring vertically alternating stacks (32, 46).

The first dielectric material layers (290, 940) may include first contact-level dielectric layers 290 embedding contact via structures and bit lines 982, and first interconnect-level dielectric layers 940 that embed a subset of the first metal interconnect structures 980 located above the first contact-level dielectric layers 290. The first dielectric material layers (290, 940) laterally extend along horizontal directions that are parallel to the top (i.e., major) surface 908T of the first substrate 908.

The bit lines 982 are a subset of the first metal interconnect structures 980 and may electrically contact drain regions located above the semiconductor channel at the top of the memory opening fill structures 58. The contact via structures contact various nodes of the first semiconductor devices. Interconnect metal lines and interconnect metal via structures, which are subsets of the first metal interconnect structures 980, may be embedded in the first interconnect-level dielectric layers 940. The first metal interconnect structures 980 may be located within the first interconnect-level dielectric layers 940. Each of the first contact-level dielectric layers 290 and the first interconnect-level dielectric layers 940 may include a dielectric material such as undoped silicate glass, a doped silicate glass, organosilicate glass, silicon nitride, a dielectric metal oxide, or a combination thereof.

An optional first passivation dielectric layer 950 can be formed over the first interconnect-level dielectric layers 940. The first passivation dielectric layer 950 can include a dielectric diffusion barrier material such as silicon nitride. The thickness of the first passivation dielectric layer 950 can be in a range from 5 nm to 100 nm, although lesser and greater thicknesses can also be employed.

A first bonding dielectric layer 970 can be formed over the first passivation dielectric layer 950. The first bonding dielectric layer 970 includes a dielectric material that can embed first bonding pads and additional first metal interconnect structures such as interconnection metal via structures. For example, the first bonding dielectric layer 970 can include undoped silicate glass (i.e., silicon oxide), and can have a thickness in a range from 300 nm to 1,000 nm, although lesser and greater thicknesses can also be employed.

Patterned cavities can be formed in the first bonding dielectric layer 970 by performing at least one combination of a lithographic patterning process that applies and patterns a photoresist layer to form openings therethrough and an anisotropic etch process that transfers the pattern of the openings at least partially through the first bonding dielectric layer 970. The patterned cavities may include integrated cavities in which via cavities vertically extending to a top surface of a respective underlying on the first metal interconnect structures 980 are adjoined to an overlying laterally-extending cavity having the shape of a line or a pad. Each laterally-extending cavity may have a polygonal shape, a rounded polygonal shape, or a generally curvilinear two-dimensional shape.

At least one conductive material such as a conductive metallic liner material (e.g., TiN, TaN, and/or WN) and a conductive metallic fill material that enables metal-to-metal bonding (such as copper) can be deposited in the patterned cavities. Excess portions of the at least one conductive material can be removed from above the horizontal plane including the top surface of the first bonding dielectric layer 970 by a planarization process such as chemical mechanical planarization (CMP). Each remaining portion of the at least one conductive material that fills a respective patterned cavity constitutes an integrated pad and via structure that includes a proximal bonding pad 982 and at least one metal via structure, or an integrated line and via structure that includes a metal line and at least one metal via structure. Each metal line within the integrated line and via structures is herein referred to as a pad-level metal line 984. Each metal via structure that is adjoined to a proximal bonding pad 982 or a pad-level metal line 984 is an additional first metal interconnect structure 980. The proximal bonding pads 982 are subsequently bonded to a respective second bonding pad of a second semiconductor die, and the pad-level metal lines 984 are not subsequently bonded to any bonding pad of the second semiconductor die.

Each pad-level metal line 984 is a metal line structure that extends laterally, and may have a horizontal cross-sectional shape of a polygon, a rounded polygon, or another curvilinear two-dimensional shape having a closed periphery. Each of the proximal bonding pads 982 and the pad-level metal lines 984 can have a thickness in a range from 100 nm to 500 nm, although lesser and greater thicknesses can also be employed. Each proximal bonding pad 982 can have a lateral dimension (such as a length, a width, and/or a diameter) in a range from 500 nm to 50,000 nm, although lesser and greater dimensions may also be employed.

While the present disclosure is described employing an embodiment in which the proximal bonding pads 982 and the pad-level metal lines 984 are formed as a component of an integrated pad and via structure or an integrated line and via structure, embodiments are expressly contemplated herein in which the first bonding dielectric layer 970 is formed as a stack of a lower dielectric sub-layer and an upper dielectric sub-layer. In this case, the metal via structures are formed first through the lower sub-layer of the first bonding dielectric layer 970. The upper sub-layer of the first bonding dielectric layer 970 is subsequently formed over the metal via structures and the lower sub-layer of the first bonding dielectric layer 970, and the proximal bonding pads 982 and the pad-level metal lines 984 are formed in the upper sub-layer of the first bonding dielectric layer 970. Generally, the metal via structures, the proximal bonding pads 982, and the pad-level metal lines 984 may be formed employing a dual damascene process or two single damascene processes.

The top surfaces of the proximal bonding pads 982 and the pad-level metal lines 984 can be coplanar with the top surface of the first bonding dielectric layer 970. The top surfaces of the proximal bonding pads 982 and the pad-level metal lines 984 are more distal from the first substrate 908 than the bottom surfaces of the proximal bonding pads 982 and the pad-level metal lines 984 are from the first substrate 908. Thus, the top surfaces of the proximal bonding pads 982 and the pad-level metal lines 984 are herein referred to as distal surfaces, and the bottom surfaces of the proximal bonding pads 982 and the pad-level metal lines 984 are herein referred to as proximal surfaces.

Figure 1B:
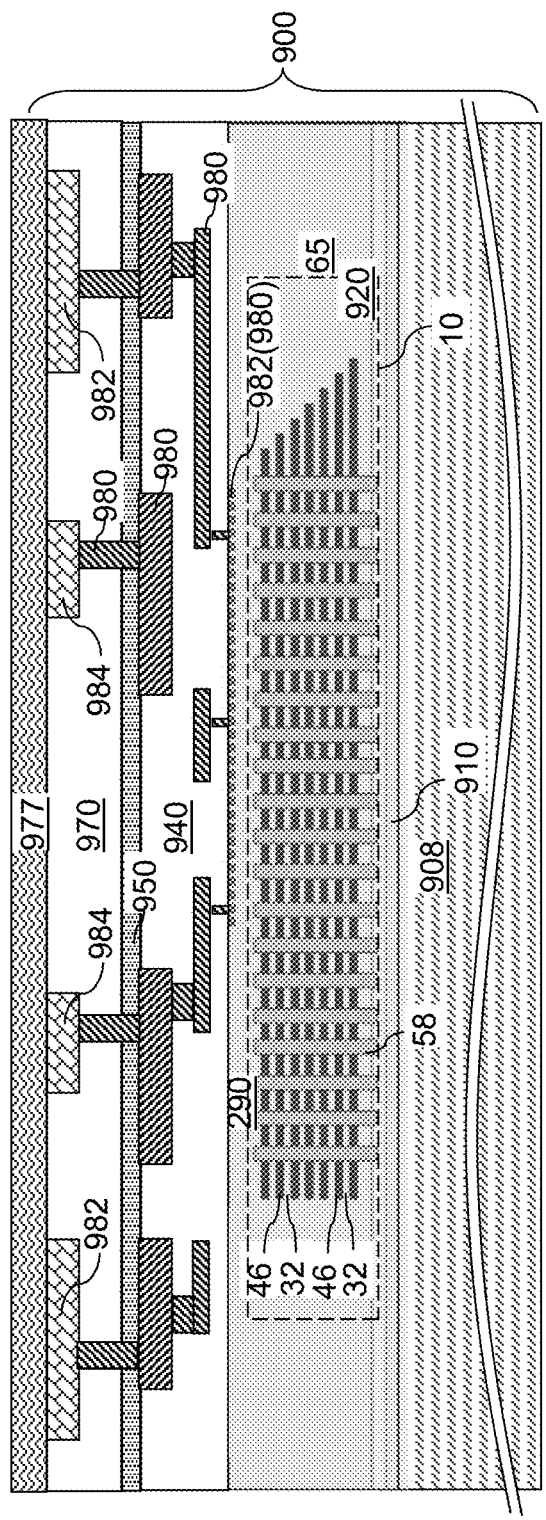

Referring to FIG. 1B, a sacrificial matrix layer 977 can be formed over the first bonding dielectric layer 970. The sacrificial matrix layer 977 includes a material that can be subsequently removed selective to the material of the first bonding dielectric layer 970. For example, if the first bonding dielectric layer 970 includes undoped silicate glass (e.g., silicon oxide), then the sacrificial matrix layer 977 can include a material, such as a doped silicate glass, silicon nitride or silicon carbonitride ("SiCN") that can be etched at a higher etch rate than the undoped silicate glass of the first bonding dielectric layer 970. In one embodiment, the sacrificial matrix layer 977 includes borosilicate glass or silicon nitride. The thickness of the sacrificial matrix layer 977 can be in a range from 100 nm to 500 nm, although lesser and greater thicknesses can also be employed.

Figure 1C:
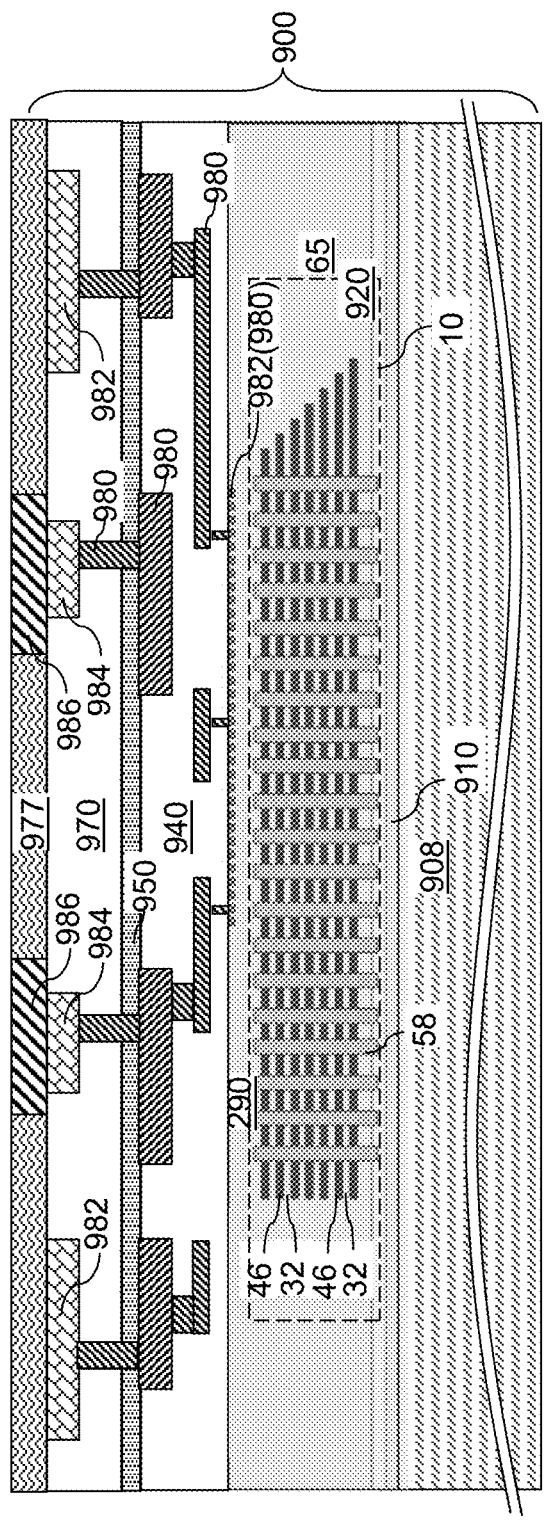

Referring to FIG. 1C, a photoresist layer (not shown) can be applied over the top surface of the sacrificial matrix layer 977, and can be lithographically patterned to form discrete openings therein. The discrete openings in the photoresist layer can overlie a respective one of the pad-level metal lines 984. The horizontal cross-sectional shape of each discrete opening in the photoresist layer may be any shape that can be employed for a bonding pad to be subsequently formed within the sacrificial matrix layer 977. An anisotropic etch process can be performed to etch unmasked portions of the sacrificial matrix layer 977 employing the photoresist layer 977 as an etch mask layer. Pad cavities extending through the entire thickness of the sacrificial matrix layer 977 can be formed by the anisotropic etch process. A top surface of a respective one of the pad-level metal lines 984 can be physically exposed at the bottom of each pad cavity. The photoresist layer can be subsequently removed, for example, by ashing.

At least one conductive material can be deposited in the pad cavities. Excess portions of the at least one conductive material overlying the horizontal plane including the top surface of the sacrificial matrix layer 977 can be removed by a planarization process such as a chemical mechanical planarization (CMP) process. Each remaining portion of the at least one conductive material that fills a respective pad cavity constitutes a bonding pad, which is herein referred to as a distal bonding pad 986.

The at least one conductive material deposited in the pad cavities can include a conductive metallic liner material and a metallic fill material. Thus, each distal bonding pad 986 can include a stack of a conductive metallic liner including the conductive metallic liner material and a metallic fill material portion including the metallic fill material. The conductive metallic liner can include a conductive metallic nitride material such as TiN, TaN, and/or WN. The metallic fill material includes a metal that can be employed for metal-to-metal bonding such as copper.

The distal bonding pad 986 can have a lateral dimension (such as a length, a width, and/or a diameter) in a range from 500 nm to 50,000 nm, although lesser and greater dimensions may also be employed. The thickness of the distal bonding pads 986 can be the same as, or approximately the same as, the thickness of the sacrificial matrix layer 977, and can be in a range from 100 nm to 500 nm, although lesser and greater thicknesses can also be employed. The proximal bonding pads 982 and the distal bonding pads 986 are collectively referred to as first bonding pads (982, 986). The distal bonding pads 986 can be formed on a distal surface (i.e., a top surface) of a respective one of the pad-level metal lines 984. At least a center portion of the bottom surface of each distal bonding pad 986 contacts a distal surface (i.e., a top surface) of an underlying pad-level metal line 984. As such, the distal bonding pads 986 can have bottom surfaces (proximal surfaces) that are located within the same horizontal plane as the top surfaces (distal surfaces) of the proximal bonding pads 982.

Figure 1D:
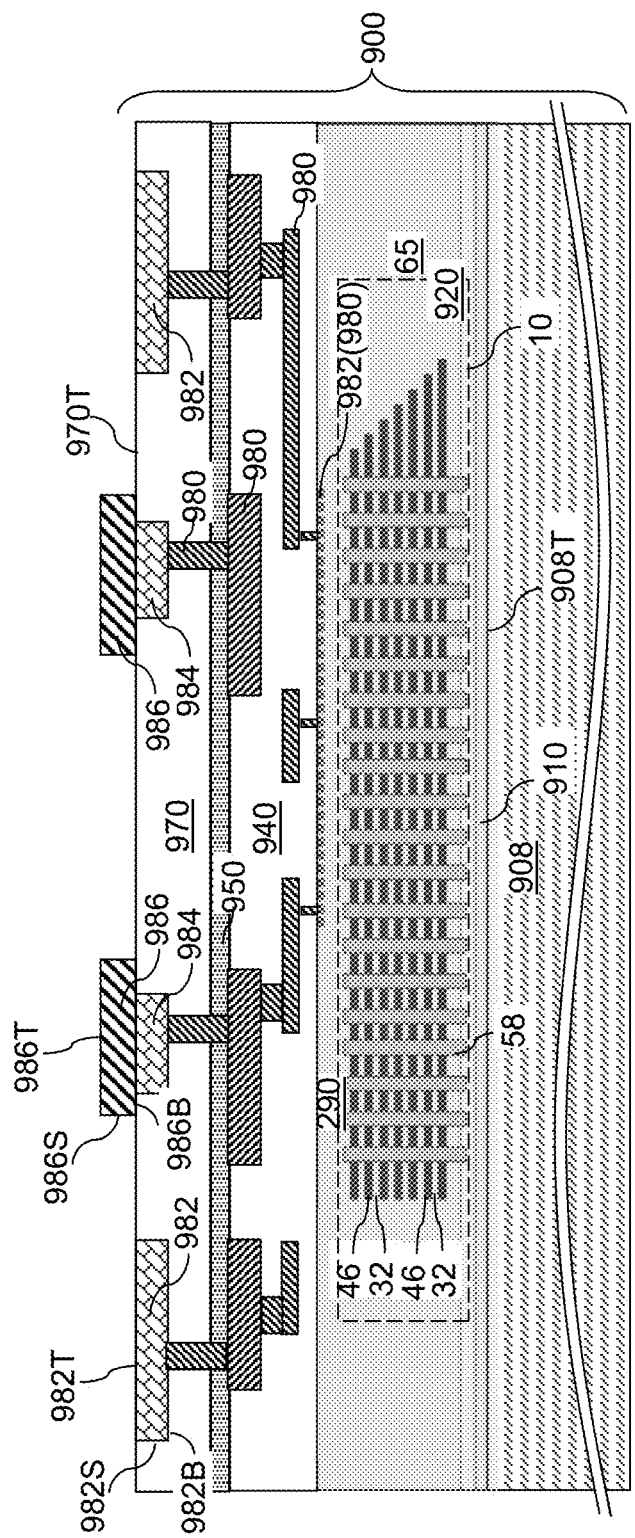

Referring to FIG. 1D, the sacrificial matrix layer 977 can be removed selective to the distal bonding pads 986, the proximal bonding pads 982, the pad-level metal lines 984, and the first bonding dielectric layer 970 by a selective recess etch process. The recess etch process can comprise an anisotropic etch process or an isotropic etch process. In an illustrative example, if the sacrificial matrix layer 977 includes silicon nitride and if the first bonding dielectric layer 970 includes undoped silicate glass, a wet etch process employing hot phosphoric acid can be employed to etch the sacrificial matrix layer 977 selective to the first bonding dielectric layer 970 and various metallic structures (982, 984, 986) located on, or in, the first bonding dielectric layer 970. The proximal bonding pads 982 have a top surface 982T facing away from the first semiconductor devices 920, a bottom surface 982B facing the first semiconductor devices 920 and at least one sidewall 982S located between the top surface and the bottom surface. The distal bonding pads 986 have a top surface 986T facing away from the first semiconductor devices 920, a bottom surface 986B facing the first semiconductor devices 920 and at least one sidewall 986S located between the top surface and the bottom surface. The top surface 982T of the proximal bonding pads 982 and the bottom surface 986B of the distal bonding pads 986 may be in the same horizontal plane as the distal (i.e., top) surface 970T of the first bonding dielectric layer 970.

Distal horizontal surfaces (i.e., top surfaces 982T) of the proximal bonding pads 982 are physically exposed by removing the sacrificial matrix layer 977 selective to the first bonding dielectric layer 970. Distal horizontal surfaces (i.e., top surfaces 986T) and the sidewall(s) 986S of the distal bonding pads 986 are physically exposed after the recess etch process. The first bonding pads (982, 986) can be electrically connected to a respective node of the first semiconductor devices 920 through a respective subset of the first metal interconnect structures 980. The first bonding pads (982, 986) comprise the proximal bonding pads 982 embedded within the first bonding dielectric layer 970 and the distal bonding pads 986 that have at least a portion of the sidewall 986S that overlie the first bonding dielectric layer 970. In one embodiment, the entire distal bonding pads 986 overlie the first bonding dielectric layer 970. In contrast, in one embodiment, the entire sidewalls 982S of the proximal bonding pads 982 are embedded in the first bonding dielectric layer 970 and are not exposed.

Figure 2A:
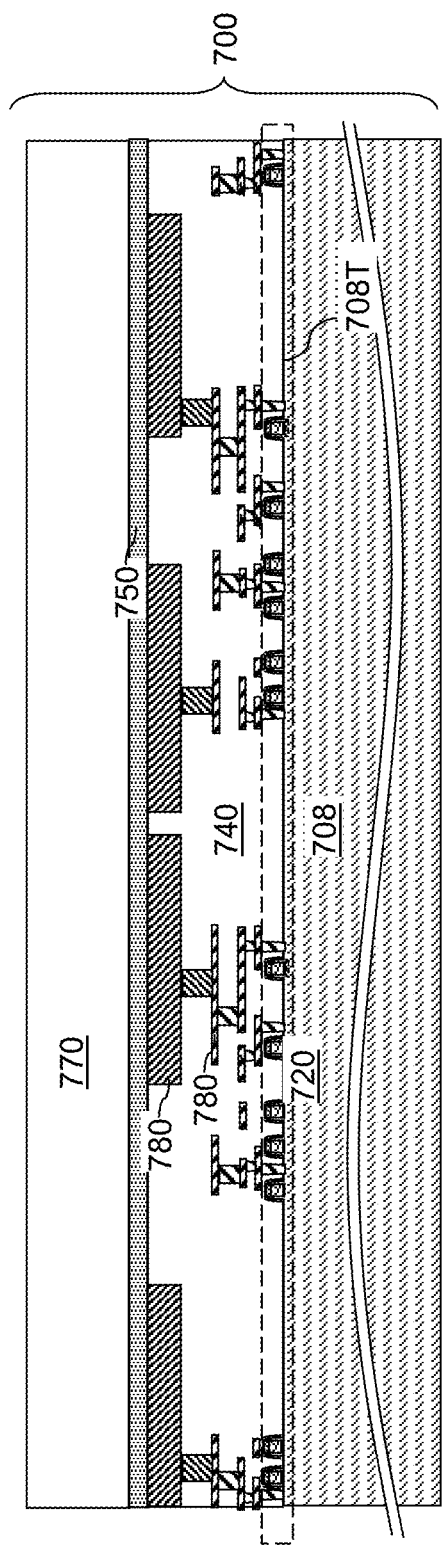
FIGS. 2A-2D are sequential schematic vertical cross-sectional views of a second semiconductor die prior to bonding according to the first embodiment of the present disclosure.

Referring to FIG. 2A, a second semiconductor die 700 is illustrated. The second semiconductor die 700 includes a second substrate 708, second semiconductor devices 720 overlying the second substrate 708, second dielectric material layers 740 overlying the second semiconductor devices 720, and second metal interconnect structures 780 embedded in the second dielectric material layers 740. In one embodiment, the second semiconductor devices 720 may include field effect transistors in a complementary metal oxide semiconductor (CMOS) configuration. In one embodiment, the second substrate 708 may be a commercially available silicon substrate having a thickness in a range from 500 microns to 1 mm.

Generally, the second semiconductor devices may comprise any semiconductor device that may be operated in conjunction with the first semiconductor devices in the first semiconductor die 900 to provide enhanced functionality. In one embodiment, the first semiconductor die 900 comprises a memory die and the second semiconductor die 700 comprises a logic die that includes a support circuitry (i.e., driver or peripheral circuitry) for operation of memory devices (such as a three-dimensional array of memory elements) within the memory die. In one embodiment, the first semiconductor die 900 may include a three-dimensional memory device including a three-dimensional array of memory elements, word lines (that may comprise a subset of the electrically conductive lines 46), and bit lines 982, the second semiconductor devices 720 of the second semiconductor die 700 may include a peripheral circuitry for operation of the three-dimensional array of memory elements. The peripheral circuitry may include one or more word line driver circuits that drive the word lines of the three-dimensional array of memory elements of the first semiconductor die 900, one or more bit line driver circuits that drive the bit lines 982 of the first semiconductor die 900, one or more word line decoder circuits that decode the addresses for the word lines, one or more bit line decoder circuits that decode the addresses for the bit lines 982, one or more sense amplifier circuits that sense the states of memory elements within the memory opening fill structures 58 of the first semiconductor die 900, a source power supply circuit that provides power to the horizontal semiconductor channel layer 10 in the first semiconductor die 900, a data buffer and/or latch, and/or any other semiconductor circuit that may be used to operate three-dimensional memory device of the first semiconductor die 900.

An optional second passivation dielectric layer 750 can be formed over the second interconnect-level dielectric layers 740. The second passivation dielectric layer 750 can include a dielectric diffusion barrier material such as silicon nitride. The thickness of the second passivation dielectric layer 750 can be in a range from 5 nm to 100 nm, although lesser and greater thicknesses can also be employed.

A second bonding dielectric layer 770 can be formed over the second passivation dielectric layer 750. The second bonding dielectric layer 770 includes a dielectric material that can embed second bonding pads and additional second metal interconnect structures such as interconnection metal via structures. For example, the second bonding dielectric layer 770 can include silicon oxide, and can have a thickness in a range from 300 nm to 1,000 nm, although lesser and greater thicknesses can also be employed. Horizontal directions in the second die 700 are parallel to the top (i.e., major) surface 708T of the second substrate 708.

Figure 2B:
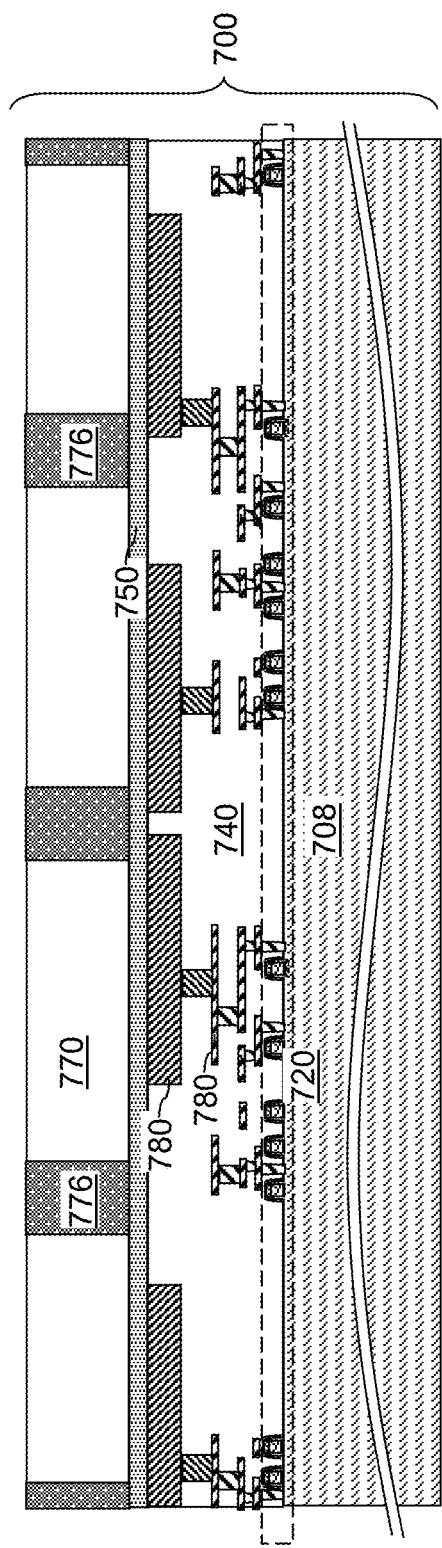

Referring to FIG. 2B, pad-level trenches can be formed through the second bonding dielectric layer 770. For example, a photoresist layer (not shown) can be applied over the top surface of the second bonding dielectric layer 770, and can be lithographically patterned to form openings therethrough. The pattern of the openings in the photoresist layer can be selected such that each opening in the photoresist layer is formed in an area located immediately adjacent to a respective second bonding pad to be subsequently formed in the second bonding dielectric layer 770. Thus, the areas of openings in the photoresist layer can be located outside of, but borders on, the areas of a subset of the second bonding pads to be subsequently formed in the second bonding dielectric layer 770.

An anisotropic etch process can be performed to etch through the second bonding dielectric layer 770 employing the patterned photoresist layer as an etch mask. The pad-level trenches can extend through the entire thickness of the second bonding dielectric layer 770 with straight sidewalls, which may be vertical sidewalls or tapered sidewalls having a taper angle in a range from 0 degree to 10 degrees. The second passivation dielectric layer 750 can be employed as an etch stop layer for the anisotropic etch process. The photoresist layer can be subsequently removed, for example, by ashing.

A dielectric material which has a lower etch rate than the material of the second bonding dielectric layer 770 can be deposited in the pad-level trenches. For example, silicon nitride which has a lower etch rate than silicon oxide of the second bonding dielectric layer 770 can be deposited. In one embodiment, the dielectric material may have a higher Young's modulus than the material of the second bonding dielectric layer 770. For example, if the second bonding dielectric layer 770 includes a silicon oxide material having Young's modulus of about 70 GPa, then silicon nitride can be deposited in the pad-level trenches. Silicon nitride has Young's modulus that depends on the process parameters employed in the deposition process, and is generally in a range from 160 GPa to 300 GPa, 200 GPa being typical.

Excess portions of the deposited dielectric material that is deposited into the pad-level trenches can be removed from above the horizontal plane including the top surface of the second bonding dielectric layer 770. In one embodiment, the dielectric material that fills the pad-level trenches can be deposited as a conformal dielectric material layer, and the pad-level trenches can have a width that is less than two times the thickness, and preferably less than 1.5 times the thickness, of a horizontal portion of the conformal dielectric material layer that is deposited over the second bonding dielectric layer 770 to provide complete filling of the pad-level trenches. The excess portions of the conformal dielectric material layer that overlies the horizontal plane including the top surface of the second bonding dielectric layer 770 can be removed by a planarization process such as a recess etch process. The recess etch process may be an isotropic etch process or an isotropic etch process. For example, the recess etch process may be a timed wet etch process. In one embodiment, the dielectric material that fills the pad-level trenches can include silicon nitride, and the recess etch process can include a wet etch process employing hot phosphoric acid. Remaining portions of the dielectric material that fill the pad-level trenches constitute dielectric isolation structures 776. The top surfaces of the dielectric isolation structures 776 may be coplanar with, or may be recessed below, the horizontal plane including the top surface (i.e., the distal surface) of the second bonding dielectric layer 770. The dielectric isolation structures 776 can have vertical sidewalls, and the distal horizontal surface (i.e., the top surface) of each dielectric isolation structure 776 can have the same width as the proximal horizontal surface (i.e., the bottom surface) of the same dielectric isolation structure 776. Alternatively, the dielectric isolation structures 776 can have tapered sidewalls, and the distal horizontal surface of each dielectric isolation structure 776 can have a greater width than the proximal horizontal surface of the same dielectric isolation structure 776.

Figure 2C:
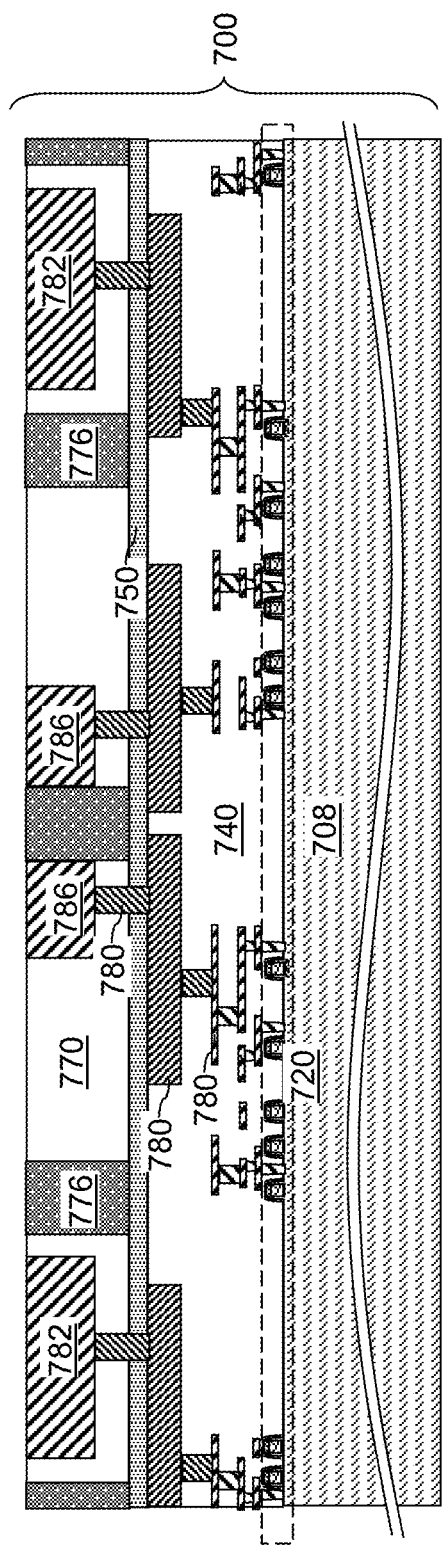

Referring to FIG. 2C, pad and via cavities can be formed in the second bonding dielectric layer 770 by performing lithographic patterning process steps and anisotropic etch process steps. For example, a first photoresist layer can be applied over the second bonding dielectric layer 770, and can be lithographically patterned with a pattern of via cavities. The pattern of the via cavities can be transferred at least partly through the second bonding dielectric layer 770 by a first anisotropic etch process. The first photoresist layer can be removed, for example, by ashing. A second photoresist layer can be applied over the second bonding dielectric layer 770, and can be lithographically patterned with a pattern of bonding pads to be subsequently formed. The pattern of the bonding pads in the second photoresist layer can be subsequently transferred into an upper portion of the second bonding dielectric layer 770 by a second anisotropic etch process. The via cavities can be vertically extended to a top surface of a respective one of the second metal interconnect structures 780 during the second anisotropic etch process. The via cavities within the pad and via cavities are adjoined to a respective overlying pad cavity. Sidewalls of the pad cavities in the pad and via cavities extend vertically from the horizontal plane including the top surface of the second bonding dielectric layer 770 to a respective bottom surface located within a horizontal plane located between the top surface and the bottom surface of the second bonding dielectric layer 770. Each pad cavity can have a horizontal cross-sectional shape of a pad, which may have a polygonal shape, a rounded polygonal shape, or a generally curvilinear two-dimensional shape. Each pad cavity can have a depth that is greater than the thickness of the distal bonding pads 986 in the first semiconductor die 900.

At least one conductive material such as a conductive metallic liner material (e.g., TiN, TaN, and/or WN) and a conductive metallic fill material that enables metal-to-metal bonding (such as copper) can be deposited in the pad and via cavities. Excess portions of the at least one conductive material can be removed from above the horizontal plane including the top surface of the second bonding dielectric layer 770 by a planarization process such as chemical mechanical planarization (CMP). Each remaining portion of the at least one conductive material that fills a respective pad and via cavity constitutes an integrated pad and via structure that includes a second bonding pad (782, 786) and a metal via structure, which is an additional second metal interconnect structure 780. Each metal via structure within the integrated pad and via structures can contact an underlying second metal interconnect structure 780. The second bonding pads (782, 786) can have a thickness that is greater than the thickness of the distal bonding pads 986.

In one embodiment, the second bonding pads (782, 786) include a first subset of the second bonding pads (782, 786) that are formed with a mirror image pattern of the pattern of the proximal bonding pads 982 of the first semiconductor die 900. Each second bonding pad within the first subset of the second bonding pads (782, 786) is herein referred to as a second vertical-bonding pad 782. The second bonding pads (782, 786) include a second subset of the second bonding pads (782, 786) that are formed with a pattern that does not overlap with the mirror image pattern of the pattern of the proximal bonding pads 982 and the distal bonding pads 986.

Each second bonding pad within the second subset of the second bonding pads (782, 786) is herein referred to as a second side-bonding pad 786. In one embodiment, the second side-bonding pads 786 can contact a respective one of the dielectric isolation structures 776 on one side.

In one embodiment, the second side-bonding pads 786 can be arranged such that sidewalls of the second side-bonding pads 786 can be subsequently disposed within a bonding distance from sidewalls of the distal bonding pads 986. The bonding distance refers to the total distance by which a facing pair of sidewalls of two bonding pads can move to form a bonding interface. The bonding distance is a function of the material of the bonding pads, the geometry of the bonding pads, and the anneal temperature employed for the bonding process, and can be in a range from 50 nm to 150 nm, and is typically about 100 nm. In other words, a bonding surface of a bonding pad moves along a direction perpendicular to a physically exposed surface of the bonding pad by a distance in a range from 25 nm to 75 nm during an anneal process, which can be at an elevated temperature in a range from 300 degrees to 400 degrees.

Figure 2D:
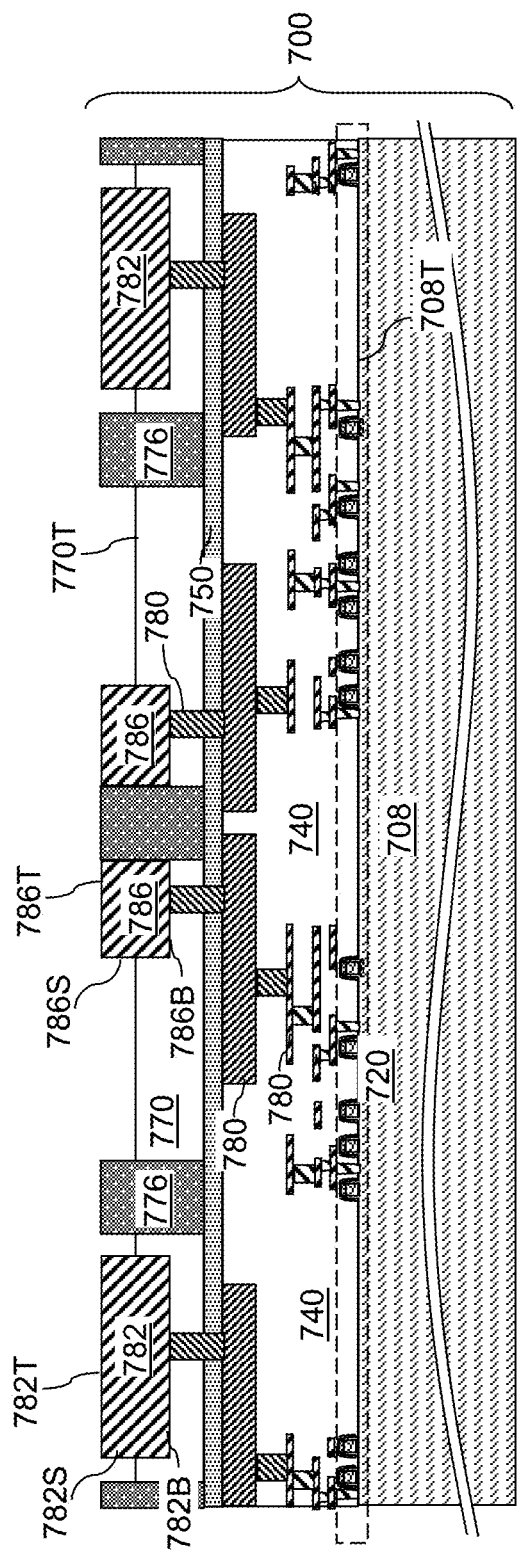

Referring to FIG. 2D, the second bonding dielectric layer 770 can be vertically recessed selective to the second bonding pads (782, 786) and the dielectric isolation structures 776 by a selective recess etch process. The recess etch process can include an isotropic etch process or an anisotropic etch process, and vertically recessed the physically exposed horizontal surface of the second bonding dielectric layer 770 by a vertical recess distance, which can be the same as the thickness of the distal bonding pads 986. In an illustrated example, the second bonding dielectric layer 770 can include a silicon oxide material such as undoped silicate glass or a doped silicate glass and the dielectric isolation structures 776 can include silicon nitride, and the recess etch process can include a timed wet etch process that etches the silicon oxide material selective to the dielectric isolation structures 776 and the second bonding pads (782, 786). Sidewalls (782S, 786S) of the second bonding pads (782, 786) are physically exposed. The second bonding pads (782, 786) each have a respective top surface (782T, 786T) facing away from the second semiconductor devices 720, a respective bottom surface (782B, 786B) facing the second semiconductor devices 720 and at least one respective sidewall (782S, 786S) located between the respective top surfaces and the bottom surfaces. The top surfaces (782T, 786T) of the second bonding pads (782, 786) may be in the same horizontal plane as the distal (i.e., top) surface 770T of the second bonding dielectric layer 770.

Generally, the second semiconductor die 700 includes a second substrate 708, second semiconductor devices 720, second metal interconnect structures 780 embedded in second dielectric material layers 740 that laterally extend along horizontal directions, and second bonding pads (782, 786) that are electrically connected to a respective node of the second semiconductor devices 720 through a respective subset of the second metal interconnect structures 720. The top surfaces and upper segments of sidewalls of the second bonding pads (782, 786) can be physically exposed.

Figure 3:
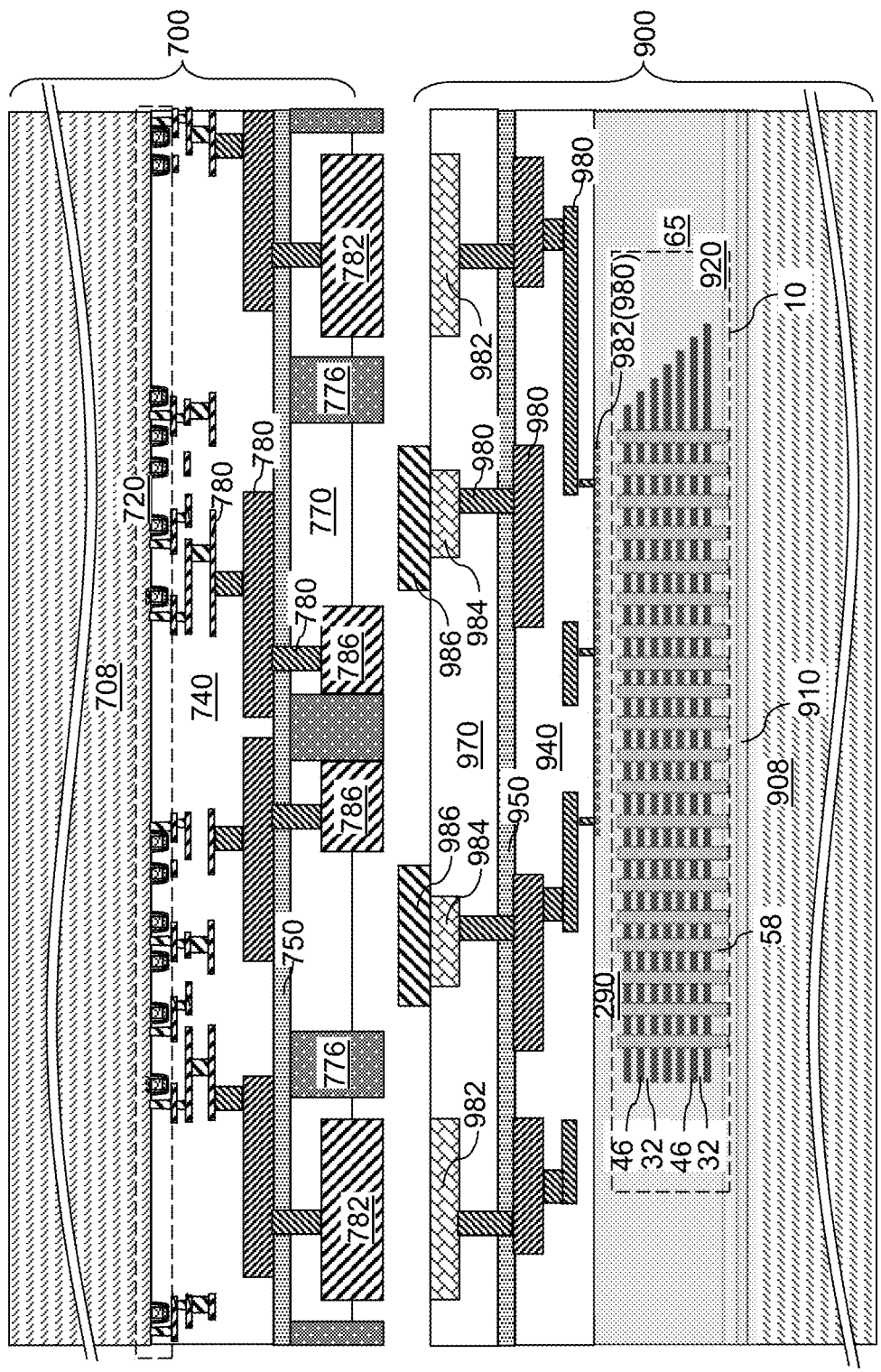
FIG. 3 is a schematic vertical cross-sectional view of a first exemplary structure after aligning the second substrate to the first substrate prior to bonding according to the first embodiment of the present disclosure.

Referring to FIG. 3, the first semiconductor die 900 and the second semiconductor die 700 are oriented such that the first bonding dielectric layer 970 faces the second bonding dielectric layer 770. The pattern of the proximal bonding pads 982 and the pattern of the second vertical-bonding pads 782 can be selected such that each proximal bonding pad 982 faces a respective one of the second vertical-bonding pads 782. In one embodiment, each proximal bonding pad 982 can have an areal overlap with a respective one of the second vertical-bonding pads 782 in a plan view after the first semiconductor die 900 is aligned to the second semiconductor die 700 such that the area of the overlap is greater than 80% of the lesser of the area of the proximal bonding pad 982 and the area of the second vertical-bonding pad 782.

Further, the pattern of the distal bonding pads 986 and the pattern of the second side-bonding pads 786 can be selected such that the distal bonding pads 986 and the second side-bonding pads 786 do not have any areal overlap with each other in a plan view after the first semiconductor die 900 is aligned to the second semiconductor die 700. Instead, each neighboring pair of a distal bonding pad 986 and a second side-bonding pad 786 in the plan view can have a facing pair of sidewalls that are laterally spaced apart from each other by a lateral spacing less than a bonding distance, i.e., a total distance by which the facing pair of sidewalls move by thermal expansion at an elevated temperature during a subsequent bonding process. In one embodiment, each facing pair of sidewalls of a neighboring pair of a distal bonding pad 986 and a second side-bonding pad 786 in a plan view after the first semiconductor die 900 is aligned to the second semiconductor die 700 can be laterally spaced from each other by a spacing in a range from 10 nm to 150 nm, such as from 15 nm to 75 nm.

Figure 4:
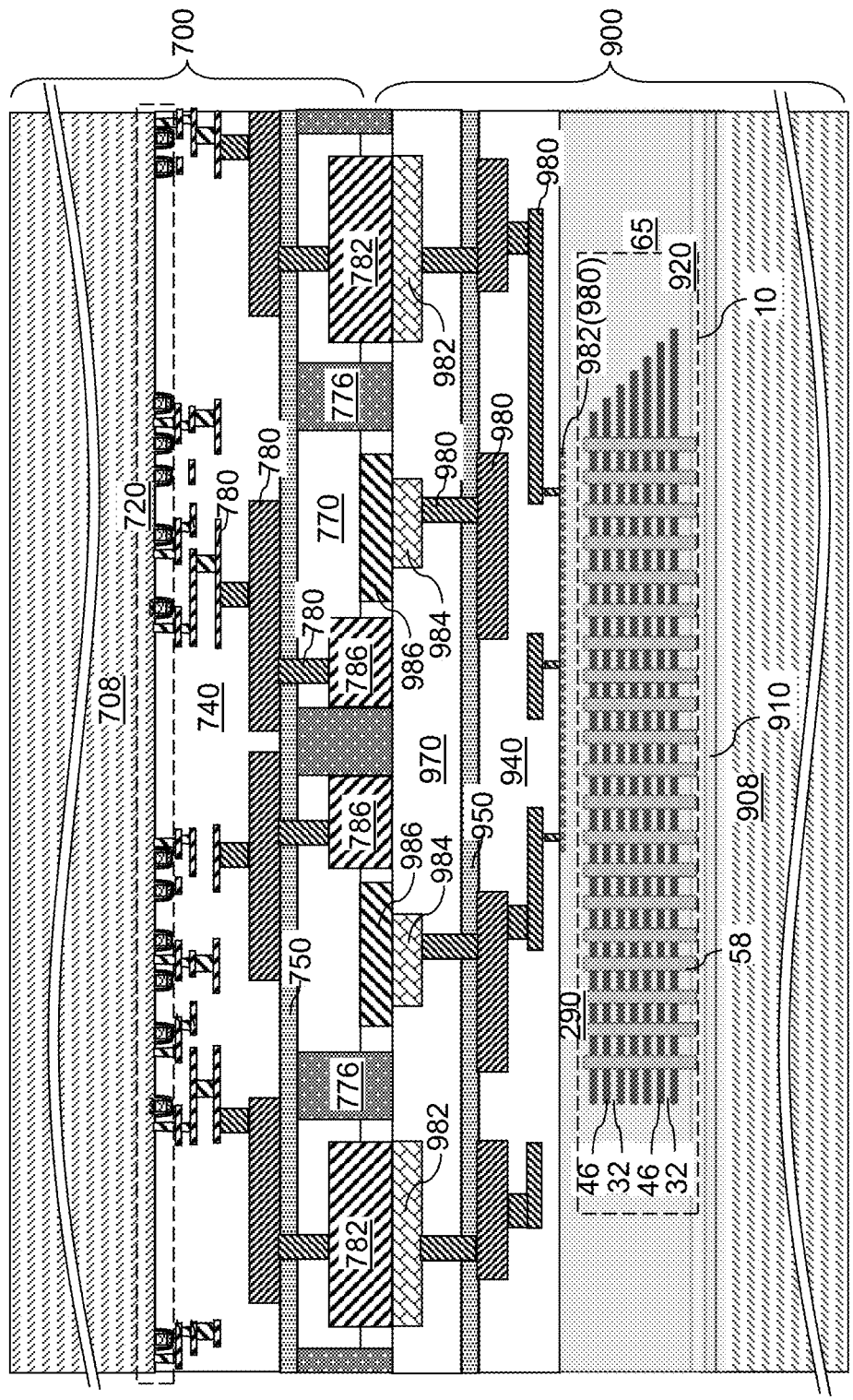
FIG. 4 is a schematic vertical cross-sectional view of the first exemplary structure after disposing the second substrate on the first substrate according to the first embodiment of the present disclosure.

Referring to FIG. 4, the first semiconductor die 900 and the second semiconductor die 700 are brought into contact with each other such that the first bonding dielectric layer 970 contacts the dielectric isolation structures 776. Each proximal bonding pad 982 can have a horizontal distal (i.e., top) surface 982T that contacts a horizontal distal (i.e., top) surface 782T of a respective one of the second vertical-bonding pads 782. Each distal bonding pad 986 can have a sidewall 986S that faces a sidewall 786S of a respective one of the second side-bonding pads 786. In one embodiment, the lateral spacing between each facing pair of a sidewall of a distal bonding pad 986 and a second side-bonding pad 786 can be in a range from 10 nm to 150 nm, such as from 15 nm to 75 nm.

Figure 5:
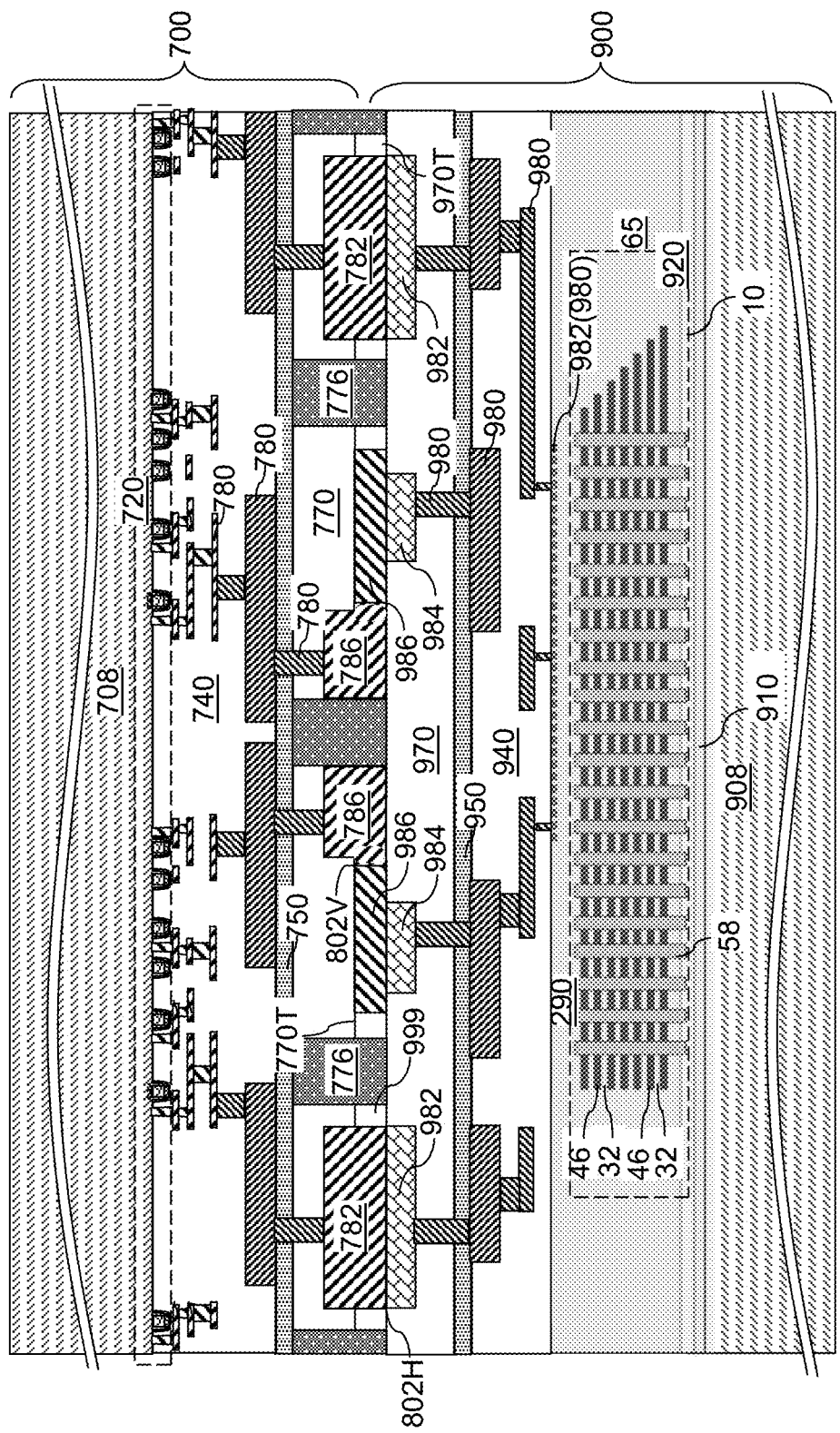
FIG. 5 is a schematic vertical cross-sectional view of the first exemplary structure after bonding the second substrate to the first substrate according to the first embodiment of the present disclosure.

Referring to FIG. 5, at least one anneal process is performed to induce bonding between the first and the second semiconductor dies. Optionally, dielectric-to-dielectric bonding between the respective dielectric isolation structures 776 and the first bonding dielectric layer 970 may be performed by annealing the dies at a relatively low temperature, such as 200 degrees Celsius to 300 degrees Celsius. Alternatively, this step may be omitted. Then, an elevated (i.e., higher) temperature anneal is performed to generate metal-to-metal bonding between each mating pair of a first bonding pad (982, 986) and a second bonding pad (782, 786). If the first bonding pads and the second bonding pads include copper, the elevated temperature may be in a range from 300 degrees Celsius to 400 degrees Celsius. The mating pairs of a first bonding pad (982, 986) and a second bonding pad (782, 786) include first-type mating pairs, each of which includes a proximal bonding pad 982 and a second vertical-bonding pad 782. Each proximal bonding pad 982 can be bonded to a respective second vertical-bonding pad 782 at a horizontal bonding interface 802H. The mating pairs of a first bonding pad (982, 986) and a second bonding pad (782, 786) include second-type mating pairs, each of which includes a distal bonding pad 986 and a second side-bonding pad 786. Each distal bonding pad 986 can be bonded to a respective second side-bonding pad 786 at a vertical bonding interface 802V.

Volume expansion of the proximal bonding pads 982 and the second vertical-bonding pads 782 can be accommodated by cavities 999 located adjacent to the second bonding pads (782, 786). Metal-to-metal bonding is formed between each mating pair of a proximal bonding pad 982 and a second vertical-bonding pad 782 at a respective horizontal bonding interface. Sidewalls of each mating pair of a distal bonding pads 986 and a second side-bonding pads 786 laterally shift toward each other, contact each other, and are bonded to each other to form a vertical bonding interface 802V. Metal-to-metal bonding is formed between each mating pair of a distal bonding pad 986 and a second side-bonding pad 786 with a respective vertical bonding interface 802V.

Thus, each of the second bonding pads (782, 786) can be bonded to a respective one of the proximal bonding pads 982 and the distal bonding pads 986. The proximal bonding pads 982 are bonded to a respective one of the second vertical-bonding pads 782 (which are a first subset of the second bonding pads (782, 786)) at a respective horizontal bonding interface 802H. The distal bonding pads 986 are bonded to a respective one of the second side-bonding pads 786 (which are a second subset of the second bonding pads (782, 786)) at a respective vertical bonding interface 802V.

In one embodiment, the dielectric isolation structures 776 contact the first bonding dielectric layer 970 after bonding the second bonding pads (782, 786) to the proximal bonding pads 982 and the distal bonding pads 986. The second bonding dielectric layer 770 can be vertically spaced from the first bonding dielectric layer 970 by the vertical recess distance (by which a physically exposed horizontal surface of the first bonding dielectric layer 970 is vertically recessed at the processing steps of FIG. 2D) after bonding the second bonding pads (782, 786) to the proximal bonding pads 982 and the distal bonding pads 986.

Distal horizontal (i.e., top) surfaces 986T (that face the second semiconductor die 700) of the distal bonding pads 986 contact a distal horizontal surface 770T (that face the first semiconductor die 900) of the second bonding dielectric layer 770 after bonding the second bonding pads (782, 786) to the proximal bonding pads 982 and the distal bonding pads 986. Cavities 999 can be formed between the first semiconductor die 900 and the second semiconductor die 700 after bonding the second bonding pads (782, 786) to the proximal bonding pads 982 and the distal bonding pads 986. Each of the cavities 999 can be encapsulated by horizontal surfaces of the first bonding dielectric layer 970 and the second bonding dielectric layer 770 and by vertical surfaces (i.e., sidewalls 986S) of the distal bonding pads 986 and the dielectric isolation structures 776.

The dielectric isolation structures 776 can be attached to the second passivation dielectric layer 750, and can create a space for horizontal metal interconnection and to increase bonding overlay tolerance. The dielectric isolation structures 776 may also optionally function as an anchor structure during lateral bonding between the distal bonding pads 986 and the second side-bonding pads 786 that prevents lateral displacement of the second side-bonding pads 786. Young's modulus of the material of the dielectric isolation structures 776 (such as silicon nitride) may be greater than Young's modulus of the material of the second bonding dielectric layer 770. This may reduce lateral displacement of the second side-bonding pads 786 away from a respective one of the distal bonding pads 986 to which the second side-bonding pads 786 are bonded. Thus, the dielectric isolation structure 776 can increase the strength of bonding between bonded pairs of a distal bonding pad 986 and a second side-bonding pad 786.

According to a second embodiment of the present disclosure, the dielectric isolation structures 776 can be formed in the first semiconductor die 900 instead of in the second semiconductor die 700.

Figure 6:
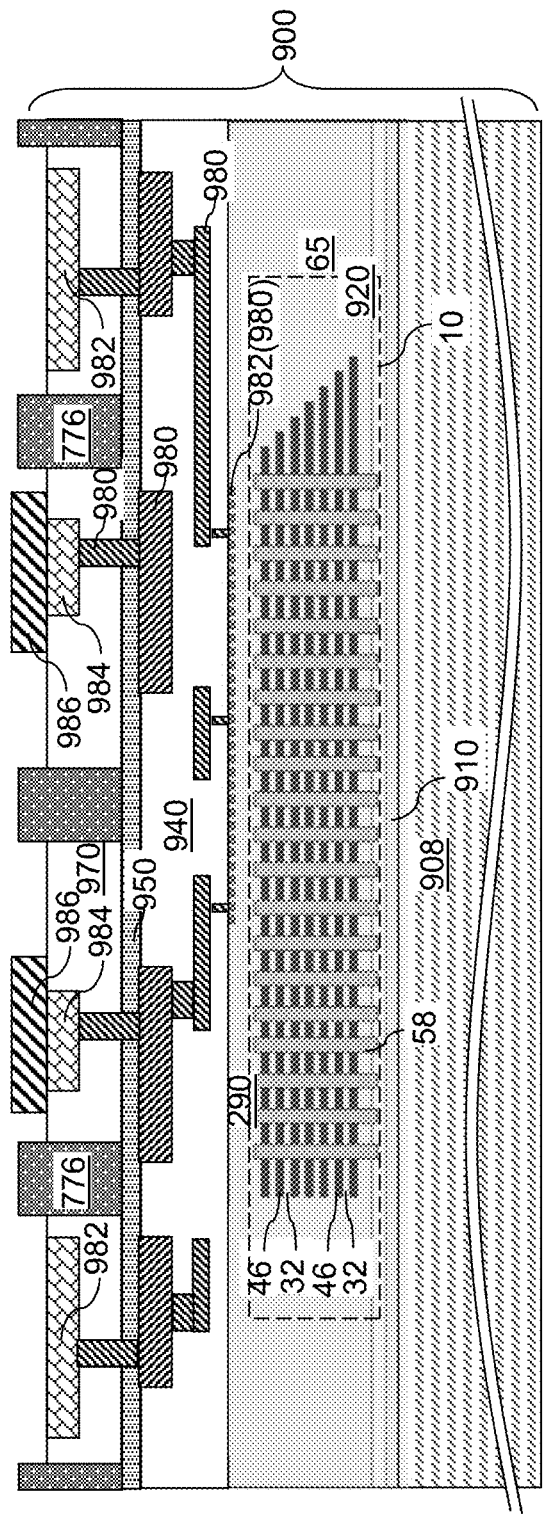
FIG. 6 is a schematic vertical cross-sectional view of a first semiconductor die prior to bonding according to a second embodiment of the present disclosure.

Referring to FIG. 6, a first semiconductor die 900 according to a second embodiment of the present disclosure is illustrated prior to bonding. The first semiconductor die 900 illustrated in FIG. 6 can be derived from the first semiconductor die 900 of FIG. 1D. Specifically, the first semiconductor die 900 of FIG. 1B can be provided, and a photoresist layer can be applied over the sacrificial matrix layer 977. The photoresist layer can be patterned with a lithographic pattern that is a mirror image of the lithographic pattern employed to form the dielectric isolation structures at the processing steps of FIG. 2B. An anisotropic etch process can be performed to form pad-level trenches extending through the sacrificial matrix layer 977 and the first bonding dielectric layer 970. The photoresist layer can be subsequently removed, for example, by ashing. A dielectric material having a higher etch resistance than the material of the first bonding dielectric layer 970 can be deposited in the pad-level trenches. For example, if the first bonding dielectric layer 970 includes a silicon oxide, then silicon nitride can be deposited in the pad-level trenches.

Excess portions of the deposited dielectric material that is deposited into the pad-level trenches can be removed from above the horizontal plane including the top surface of the sacrificial matrix layer 977. In one embodiment, the dielectric material that fills the pad-level trenches can be deposited as a conformal dielectric material layer, and removal of the excess portions of the conformal dielectric material layer from above the horizontal plane including the top surface of the second bonding dielectric layer 770 can be effected by a planarization process such as a recess etch process. In one embodiment, the dielectric material that fills the pad-level trenches can include silicon nitride, and the recess etch process can include a wet etch process employing hot phosphoric acid. Remaining portions of the dielectric material that fill the pad-level trenches constitute dielectric isolation structures 776. The top surfaces of the dielectric isolation structures 776 may be coplanar with, or may be recessed below, the horizontal plane including the top surface (i.e., the distal surface) of the sacrificial matrix layer 977.

The dielectric isolation structures 776 can have vertical sidewalls, and the distal horizontal surface (i.e., the top surface) of each dielectric isolation structure 776 can have the same width as the proximal horizontal surface (i.e., the bottom surface) of the same dielectric isolation structure 776. Alternatively, the dielectric isolation structures 776 can have tapered sidewalls, and the distal horizontal surface of each dielectric isolation structure 776 can have a greater width than the proximal horizontal surface of the same dielectric isolation structure 776.

Subsequently, the processing steps of FIGS. 1C and 1D can be performed to provide the first semiconductor die 900 illustrated in FIG. 6. Generally, the pattern of the dielectric isolation structures 776 can be selected to contact sidewalls of the second side-bonding pads 786 upon bonding the first semiconductor die 900 to the second semiconductor die 700, and/or to contact sidewalls of the distal bonding pads 986 upon bonding the first semiconductor die 900 to the second semiconductor die 700.

Figure 7:
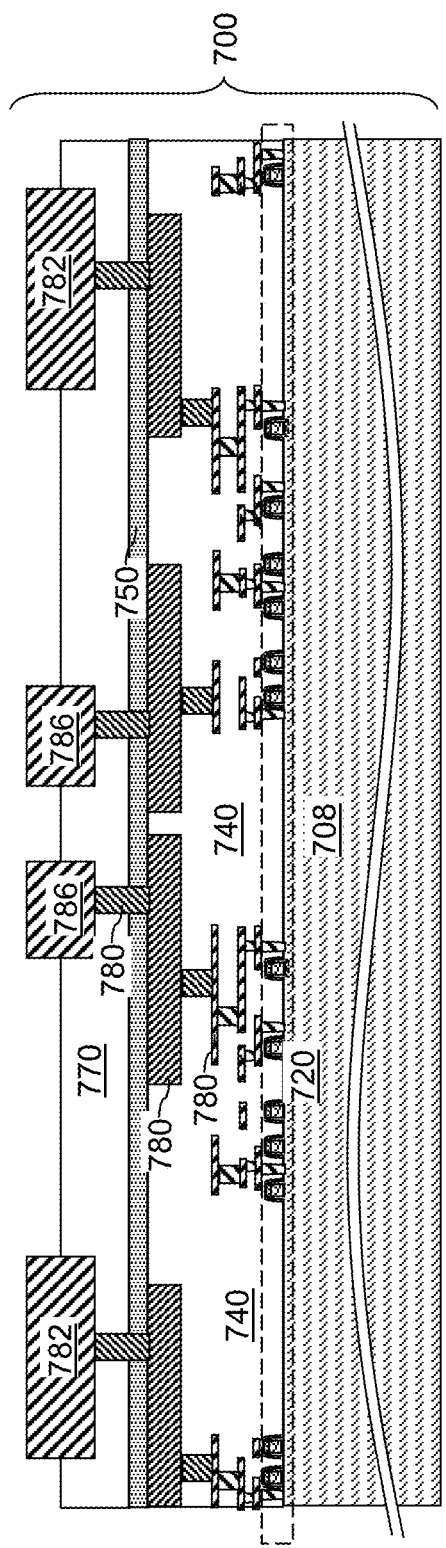
FIG. 7 is a schematic vertical cross-sectional view of a second semiconductor die prior to bonding according to the second embodiment of the present disclosure.

Referring to FIG. 7, a second semiconductor die 700 according to the second embodiment of the present disclosure is described, which can be derived from the second semiconductor die 700 of FIG. 2D by omitting formation of the dielectric isolation structures 776 at the processing steps of FIG. 2B.

Figure 8:
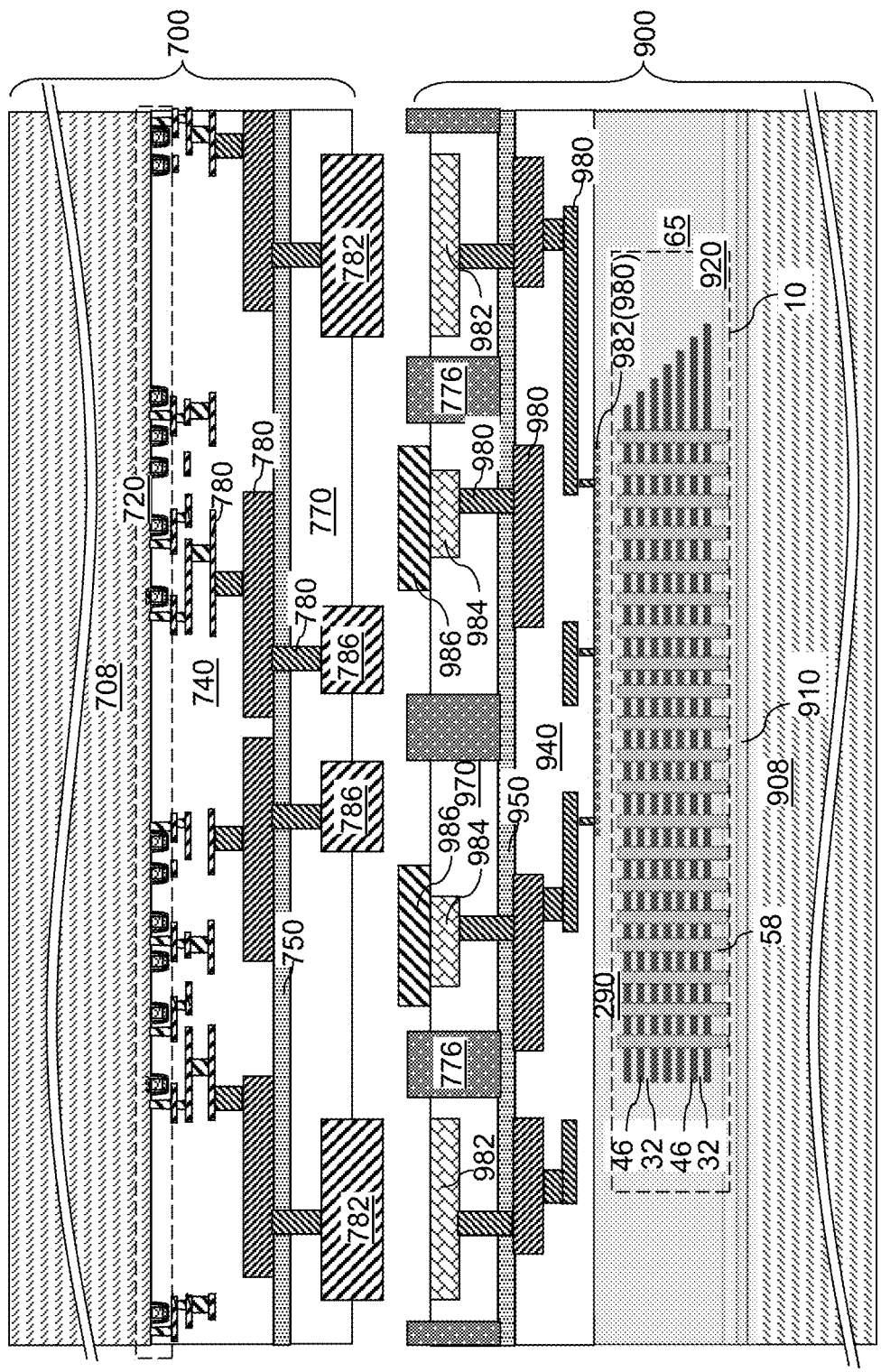
FIG. 8 is a schematic vertical cross-sectional view of a second exemplary structure after aligning the second substrate to the first substrate prior to bonding according to the second embodiment of the present disclosure.

Referring to FIG. 8, the first semiconductor die 900 and the second semiconductor die 700 are oriented such that the first bonding dielectric layer 970 faces the second bonding dielectric layer 770. The pattern of the proximal bonding pads 982 and the pattern of the second vertical-bonding pads 782 can be selected such that each proximal bonding pad 982 faces a respective one of the second vertical-bonding pads 782. In one embodiment, each proximal bonding pad 982 can have an areal overlap with a respective one of the second vertical-bonding pads 782 in a plan view after the first semiconductor die 900 is aligned to the second semiconductor die 700 such that the area of the overlap is greater than 80% of the lesser of the area of the proximal bonding pad 982 and the area of the second vertical-bonding pad 782.

Further, the pattern of the distal bonding pads 986 and the pattern of the second side-bonding pads 786 can be selected such that the distal bonding pads 986 and the second side-bonding pads 786 do not have any areal overlap with each other in a plan view after the first semiconductor die 900 is aligned to the second semiconductor die 700. Instead, each neighboring pair of a distal bonding pad 986 and a second side-bonding pad 786 in the plan view can have a facing pair of sidewalls that are laterally spaced apart from each other by a lateral spacing less than a bonding distance, i.e., a total distance by which the facing pair of sidewalls move by thermal expansion at an elevated temperature during a subsequent bonding process. In one embodiment, each facing pair of sidewalls of a neighboring pair of a distal bonding pad 986 and a second side-bonding pad 786 in a plan view after the first semiconductor die 900 is aligned to the second semiconductor die 700 can be laterally spaced from each other by a spacing in a range from 10 nm to 150 nm, such as from 15 nm to 75 nm.

Figure 9:
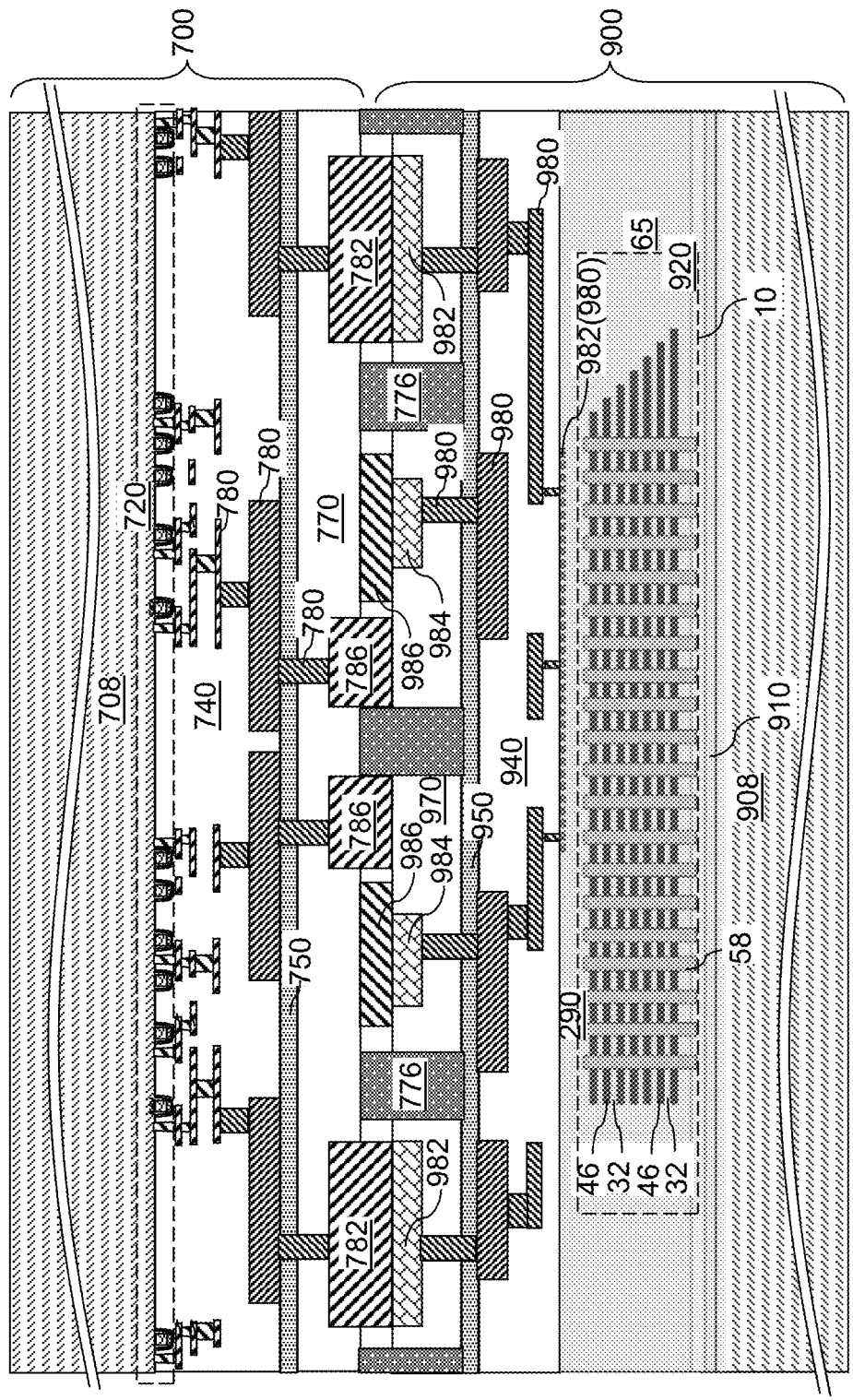
FIG. 9 is a schematic vertical cross-sectional view of the second exemplary structure after disposing the second substrate on the first substrate according to the second embodiment of the present disclosure.

Referring to FIG. 9, the first semiconductor die 900 and the second semiconductor die 700 are brought into contact with each other such that the dielectric isolation structures 776 contact the second bonding dielectric layer 770. Each proximal bonding pad 982 can have a horizontal distal surface that contacts a horizontal distal surface of a respective one of the second vertical-bonding pads 782. Each distal bonding pad 986 can have a sidewall that faces a sidewall of a respective one of the second side-bonding pads 786. In one embodiment, the lateral spacing between each facing pair of a sidewall of a distal bonding pad 986 and a second side-bonding pad 786 can be in a range from 10 nm to 150 nm, such as from 15 nm to 75 nm.

Figure 10:
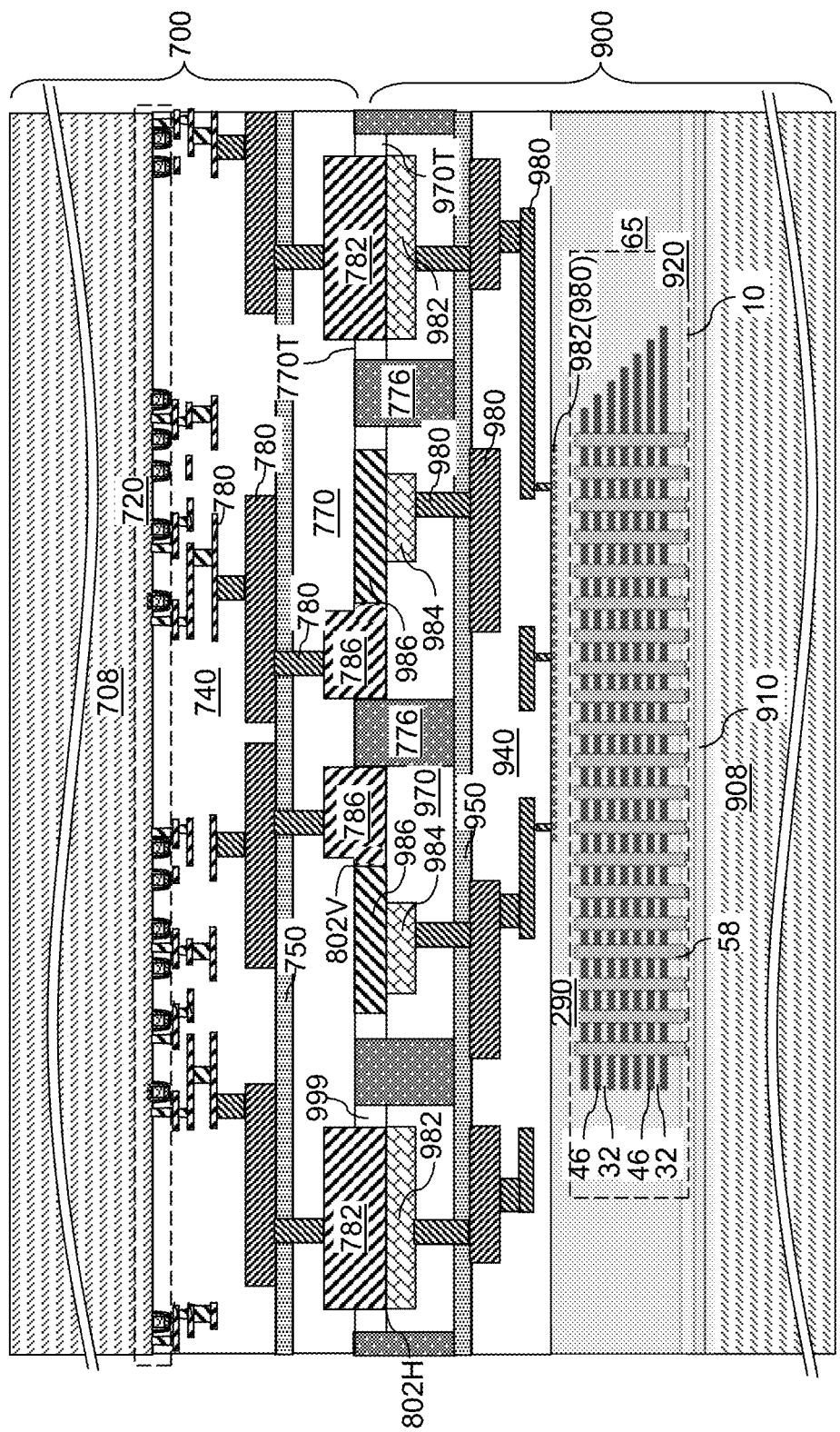
FIG. 10 is a schematic vertical cross-sectional view of the second exemplary structure after bonding the second substrate to the first substrate according to the second embodiment of the present disclosure.

Referring to FIG. 10, at least one anneal process is performed to induce bonding between the first and the second semiconductor dies. Optionally, dielectric-to-dielectric bonding between the respective dielectric isolation structures 776 and the second bonding dielectric layer 770 may be performed by annealing the dies at a relatively low temperature, such as 200 degrees Celsius to 300 degrees Celsius. Alternatively, this step may be omitted. Then, an elevated (i.e., higher) temperature anneal is performed to generate metal-to-metal bonding between each mating pair of a first bonding pad (982, 986) and a second bonding pad (782, 786). If the first bonding pads and the second bonding pads include copper, the elevated temperature may be in a range from 300 degrees Celsius to 400 degrees Celsius. The mating pairs of a first bonding pad (982, 986) and a second bonding pad (782, 786) include first-type mating pairs, each of which includes a proximal bonding pad 982 and a second vertical-bonding pad 782. Each proximal bonding pad 982 can be bonded to a respective second vertical-bonding pad 782 at a horizontal bonding interface. The mating pairs of a first bonding pad (982, 986) and a second bonding pad (782, 786) include second-type mating pairs, each of which includes a distal bonding pad 986 and a second side-bonding pad 786. Each distal bonding pad 986 can be bonded to a respective second side-bonding pad 786 at a vertical bonding interface.

Volume expansion of the proximal bonding pads 982 and the second vertical-bonding pads 782 can be accommodated by cavities 999 located adjacent to the second bonding pads (782, 786). Metal-to-metal bonding is formed between each mating pair of a proximal bonding pad 982 and a second vertical-bonding pad 782 at a respective horizontal bonding interface. Sidewalls of each mating pair of a distal bonding pads 986 and a second side-bonding pads 786 laterally shift toward each other, contact each other, and are bonded to each other to form a vertical bonding interface. Metal-to-metal bonding is formed between each mating pair of a distal bonding pad 986 and a second side-bonding pad 786 with a respective vertical bonding interface.

Thus, each of the second bonding pads (782, 786) can be bonded to a respective one of the proximal bonding pads 982 and the distal bonding pads 986. The proximal bonding pads 982 are bonded to a respective one of the second vertical-bonding pads 782 (which are a first subset of the second bonding pads (782, 786)) at a respective horizontal bonding interface 802H. The distal bonding pads 986 are bonded to a respective one of the second side-bonding pads 786 (which are a second subset of the second bonding pads (782, 786)) at a respective vertical bonding interface 802V.

In one embodiment, the dielectric isolation structures 776 contact the second bonding dielectric layer 770 after bonding the second bonding pads (782, 786) to the proximal bonding pads 982 and the distal bonding pads 986. The second bonding dielectric layer 770 can be vertically spaced from the first bonding dielectric layer 970 by the vertical recess distance (by which a physically exposed horizontal surface of the first bonding dielectric layer 970 is vertically recessed at the processing steps of FIG. 2D) after bonding the second bonding pads (782, 786) to the proximal bonding pads 982 and the distal bonding pads 986.

Distal horizontal surfaces (that face the second semiconductor die 700) of the distal bonding pads 986 contact a distal horizontal surface 770T (that face the first semiconductor die 900) of the second bonding dielectric layer 770 after bonding the second bonding pads (782, 786) to the proximal bonding pads 982 and the distal bonding pads 986. Cavities 999 can be formed between the first semiconductor die 900 and the second semiconductor die 700 after bonding the second bonding pads (782, 786) to the proximal bonding pads 982 and the distal bonding pads 986. Each of the cavities 999 can be encapsulated by horizontal surfaces of the first bonding dielectric layer 970 and the second bonding dielectric layer 770 and by vertical surfaces of the distal bonding pads 986 and the dielectric isolation structures 776.

Referring to all drawings and according to various embodiments of the present disclosure, a bonded assembly includes a first semiconductor die 900 comprising first semiconductor devices 920, a first bonding dielectric layer 970, and first bonding pads (982, 986) having a respective top surface (982T, 986T) facing away from the first semiconductor devices 920, a respective bottom surface (982B, 986B) facing the first semiconductor devices 920 and at least one respective sidewall (982S, 986S) between the respective top surfaces and the bottom surfaces. The bonded assembly also includes a second semiconductor die 700 comprising second semiconductor devices 720, a second bonding dielectric layer 770, dielectric isolation structures 776 vertically extending through the second bonding dielectric layer 770 and contacting the first bonding dielectric layer 970, and second bonding pads (782, 786) having a respective top surface (782T, 786T) facing away from the second semiconductor devices 720, a respective bottom surface (782B, 786B) facing the second semiconductor devices 720 and at least one respective sidewall (782S, 786S) between the respective top surfaces and the bottom surfaces. The sidewalls (782S, 786S) of the second bonding pads (782, 786) are bonded to the respective sidewalls (982S, 986S) of the first bonding pads (982, 986).

In one embodiment, the first semiconductor die 900 also includes a first substrate 908 having a first major surface 908T, and first metal interconnect structures 980 embedded in first dielectric material layers 940 that laterally extend along horizontal directions parallel to the first major surface 908T. The first bonding pads (982, 986) are electrically connected to a respective node of the first semiconductor devices 920 through a respective subset of the first metal interconnect structures 980. The second semiconductor die 700 also includes a second substrate 708 having a second major surface 708T, and second metal interconnect structures 780 embedded in second dielectric material layers 740 that laterally extend along the horizontal directions parallel to the second major surface 708T. The second bonding pads (782, 786) are electrically connected to a respective node of the second semiconductor devices 720 through a respective subset of the second metal interconnect structures 780.

The first bonding pads (982, 986) comprise proximal bonding pads 982 embedded within the first bonding dielectric layer 970 and distal bonding pads 986 having sidewalls 986S that at that least partially overlie the first bonding dielectric layer. The proximal bonding pads 982 are bonded to a respective one of a first subset 782 of the second bonding pads (782, 786) at a respective horizontal bonding interface 802H and the distal bonding pads 986 are bonded to a respective one of a second subset 786 of the second bonding pads (782, 786) at a respective vertical bonding interface 802V.

In one embodiment, distal horizontal surfaces 982T of the proximal bonding pads 982 and proximal horizontal surfaces 986B of the distal bonding pads 986 are located within a horizontal plane including a distal surface 970T of the first bonding dielectric layer 970. In one embodiment, the horizontal bonding interfaces 802H between the proximal bonding pads 982 the second bonding pads (782, 786) are located within the horizontal plane including the distal surface 970T of the first bonding dielectric layer 970, i.e., a horizontal surface of the first bonding dielectric layer 970 that is distal from the first substrate 908.

In one embodiment, the second bonding pads (782, 786) are embedded within a second bonding dielectric layer 770 that is vertically spaced from the horizontal plane including the distal surface 970T of the first bonding dielectric layer 970 by a vertical spacing, which can be the same as the vertical recess distance at the processing steps of FIG. 2D. In one embodiment, the vertical spacing can be the same as a vertical thickness of the distal bonding pads 986.

In one embodiment, each of the vertical bonding interfaces vertically extend from the horizontal plane including the distal surface of the first bonding dielectric layer 970 to a horizontal plane including a horizontal interface between the distal bonding pads 986 and the second bonding dielectric layer 770.

In one embodiment, the dielectric isolation structures 776 contact the first bonding dielectric layer 970 in a horizontal plane including the distal surface 770T of the first bonding dielectric layer 970. The dielectric isolation structures 776 may comprise silicon nitride and the first and the second bonding dielectric layers (970, 770) may comprise silicon oxide.

In one embodiment, cavities 999 can be encapsulated by horizontal surfaces of the first bonding dielectric layer 970 and the second bonding dielectric layer 770 and by vertical surfaces of the distal bonding pads 986 and the dielectric isolation structures 776. In one embodiment, one of the second bonding pads (782, 786), such as a second sidebonding pad 986, comprises a sidewall that contacts a sidewall of one of the dielectric isolation structures 776.

In one embodiment, the first subset 782 of the second bonding pads (782, 786) and the second subset 786 of the second bonding pads (782, 786) have a same thickness and include a respective distal horizontal surface that is located within the horizontal plane including the distal surface of the first bonding dielectric layer 970.

In one embodiment, one of the first or the second semiconductor devices (920, 720) comprise three-dimensional memory devices, and the other one of the first or the second semiconductor devices (920, 720) comprise driver circuit devices for the three-dimensional memory devices.

In one embodiment, the bonded assembly can comprise metal lines 984 embedded within the first bonding dielectric layer 970 and having a distal horizontal surface within the horizontal plane including the distal surface of the first bonding dielectric layer 970 and having a proximal horizontal surface within a horizontal plane including proximal horizontal surfaces of the proximal bonding pads 982. In one embodiment, the metal lines 984 contact a proximal horizontal surface of a respective one of the distal bonding pads 986; and each of the metal lines 984 and the proximal bonding pads 982 comprise a same set of at least one conductive material that includes a metal.

The various embodiments of the present disclosure can be employed a bonded structure including horizontal bonding interfaces and vertical bonding interfaces that are formed at the same time, which increases fabrication process speed. The total area of the bonding interfaces can be increased to provide increased density of bonds between the dies. Further, dielectric isolation structures 776 embedded in a first bonding dielectric layer 970 of a first semiconductor die 900 or in a second bonding dielectric layer 770 of a second semiconductor die 700 create a space for horizontal metal interconnection and increase bonding overlay tolerance.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A bonded assembly comprising:
a first semiconductor die comprising first semiconductor devices, a first bonding dielectric layer, and first bonding pads having a top surface facing away from the first semiconductor devices, a bottom surface facing the first semiconductor devices and at least one sidewall between the top surface and the bottom surface; and
a second semiconductor die comprising second semiconductor devices, a second bonding dielectric layer, dielectric isolation structures vertically extending through the second bonding dielectric layer and contacting the first bonding dielectric layer, and second bonding pads having a top surface facing away from the second semiconductor devices, a bottom surface facing the second semiconductor devices and at least one sidewall between the top surface and the bottom surface;
wherein:
the sidewalls of the second bonding pads are bonded to the respective sidewalls of the first bonding pads;
the first semiconductor die further comprises a first substrate having a first major surface, and first metal interconnect structures embedded in first dielectric material layers that laterally extend along horizontal directions parallel to the first major surface, wherein the first bonding pads are electrically connected to a respective node of the first semiconductor devices through a respective subset of the first metal interconnect structures;
the second semiconductor die further comprises a second substrate having a second major surface, and second metal interconnect structures embedded in second dielectric material layers that laterally extend along the horizontal directions parallel to the second major surface, wherein the second bonding pads are electrically connected to a respective node of the second semiconductor devices through a respective subset of the second metal interconnect structures;
the first bonding pads comprise proximal bonding pads embedded within the first bonding dielectric layer and distal bonding pads having sidewalls at that least partially overlie the first bonding dielectric layer;
the proximal bonding pads are bonded to a respective one of a first subset of the second bonding pads at a respective horizontal bonding interface; and
the distal bonding pads are bonded to a respective one of a second subset of the second bonding pads at a respective vertical bonding interface.

2. The bonded assembly of claim 1, wherein distal horizontal surfaces of the proximal bonding pads and proximal horizontal surfaces of the distal bonding pads are located within a horizontal plane including a distal surface of the first bonding dielectric layer.

3. The bonded assembly of claim 2, wherein the horizontal bonding interfaces between the proximal bonding pads the second bonding pads are located within the horizontal plane including the distal surface of the first bonding dielectric layer.

4. The bonded assembly of claim 2, wherein the second bonding pads are embedded within the second bonding dielectric layer that is vertically spaced from the horizontal plane including the distal surface of the first bonding dielectric layer by a vertical spacing which is the same as a vertical thickness of the distal bonding pads.

5. The bonded assembly of claim 4, wherein each of the vertical bonding interfaces vertically extend from the horizontal plane including the distal surface of the first bonding dielectric layer to a horizontal plane including a horizontal interface between the distal bonding pads and the second bonding dielectric layer.

6. The bonded assembly of claim 4, wherein the dielectric isolation structures contact the first bonding dielectric layer in a horizontal plane including the distal surface of the first bonding dielectric layer.

7. The bonded assembly of claim 6, further comprising cavities encapsulated by horizontal surfaces of the first bonding dielectric layer and the second bonding dielectric layer and by vertical surfaces of the distal bonding pads and the dielectric isolation structures.

8. The bonded assembly of claim 6, wherein one of the second bonding pads comprises a sidewall that contacts a sidewall of one of the dielectric isolation structures.

9. The bonded assembly of claim 4, wherein the first subset of the second bonding pads and the second subset of the second bonding pads have a same thickness and include a respective distal horizontal surface that is located within the horizontal plane including the distal surface of the first bonding dielectric layer.

10. The bonded assembly of claim 1, wherein the dielectric isolation structures comprise silicon nitride and the first and the second bonding dielectric layers comprise silicon oxide.

11. The bonded assembly of claim 1, wherein one of the first or the second semiconductor devices comprise three-dimensional memory devices, and the other one of the first or the second semiconductor devices comprise driver circuit devices for the three-dimensional memory devices.

* * * * *